(12) United States Patent
Endo et al.

(10) Patent No.: US 7,733,600 B2
(45) Date of Patent: Jun. 8, 2010

(54) HARD DISK DRIVE AND WIRELESS DATA TERMINAL USING THE SAME

(75) Inventors: Toshikazu Endo, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 922 days.

(21) Appl. No.: 11/529,975

(22) Filed: Sep. 29, 2006

(65) Prior Publication Data

US 2007/0076320 A1    Apr. 5, 2007

(30) Foreign Application Priority Data

Sep. 30, 2005   (JP) .............................. 2005-286690
Sep. 30, 2005   (JP) .............................. 2005-286691

(51) Int. Cl.
*G11B 33/12* (2006.01)

(52) U.S. Cl. ................................... 360/97.01

(58) Field of Classification Search .............. 360/97.01, 360/97.02, 97.03, 98.01
See application file for complete search history.

(56) References Cited

U.S. PATENT DOCUMENTS

| | | | | |
|---|---|---|---|---|
| 5,654,847 | A * | 8/1997 | Yagi et al. ................. | 360/97.02 |
| 5,930,072 | A * | 7/1999 | Shrinkle ................... | 360/97.01 |
| 5,995,321 | A * | 11/1999 | Ishida ...................... | 360/97.01 |
| 6,639,791 | B2 * | 10/2003 | Su ........................... | 361/679.33 |
| 6,697,217 | B1 * | 2/2004 | Codilian ................... | 360/97.01 |
| 7,483,237 | B2 * | 1/2009 | Hong et al. ............... | 360/97.01 |
| 2001/0019462 | A1 * | 9/2001 | Ogawa et al. .................. | 360/69 |
| 2003/0235204 | A1 * | 12/2003 | Azevedo et al. ............. | 370/466 |
| 2005/0182875 | A1 * | 8/2005 | Bruner et al. ................. | 710/74 |

FOREIGN PATENT DOCUMENTS

| | | |
|---|---|---|
| JP | 04-268279 | 9/1992 |
| JP | 2001-285179 | 10/2001 |
| JP | 2002-208253 | 7/2002 |
| JP | 2004-111037 | 4/2004 |
| JP | 2004-362523 | 12/2004 |

* cited by examiner

*Primary Examiner*—Jefferson Evans
(74) *Attorney, Agent, or Firm*—Wolff Law Offices PLLC; Kevin Alan Wolff

(57) ABSTRACT

A hard disk drive is provided with a platter, a spindle motor for driving the platter, an arm with a magnetic head attached to a distal end thereof, a voice coil motor for driving the arm, a first circuit substrate, and a drive casing for accommodating and electrically shielding the platter, spindle motor, arm, voice coil motor, and first circuit substrate. The first circuit substrate has a multilayer substrate, a plurality of digital ICs that are embedded as bare chips in the multilayer substrate, and a bus line for connecting the digital ICs. The digital ICs are disposed in a mutually horizontal configuration.

21 Claims, 21 Drawing Sheets

HARD DISK DRIVE AND WIRELESS DATA TERMINAL USING THE SAME

TECHNICAL FIELD

The present invention relates to a hard disk drive and a wireless data terminal, and particularly relates to a small thin hard disk drive that can be installed in a wireless data terminal such as a mobile telephone, and to a handheld wireless data terminal having this hard disk drive internally installed.

BACKGROUND OF THE INVENTION

The proliferation of hard disk drives in recent years has been remarkable, and these drives are now installed in a wide variety of data devices, from personal computers and video recorders to portable music players. More recently, one-inch hard disk drives with capacities of 5 GB have appeared on the market, and reductions in the size and profile of these hard disk drives are progressing rapidly. It is expected that hard disk drives will be extensively installed in mobile telephones in the future.

FIG. 18 is a schematic exploded perspective view showing the structure of a conventional hard disk drive.

As shown in FIG. 18, this hard disk drive 70 has a platter 11 which is the recording medium; a spindle motor 12 for rotatably driving the platter 11; an arm 14 with a magnetic head 13 attached to a distal end thereof; a bearing 15 that supports the rear end of the arm 14; a voice coil motor 16 for slidably driving the arm 14; first and second circuit substrates 17, 71 that are components of respective functional block control circuits; a metal casing 18 that houses and electrically shields these components; a metal casing cover 19; and a shielding plate 72 for covering the exposed surface of the second circuit substrate 71. The first circuit substrate 17 has a connector 20, and a lead opening 18a for bringing out the connector 20 from the casing is formed on the bottom surface of this casing 18. The first circuit substrate 17 and the second circuit substrate 71 are therefore connected by the connector 20. A head amplifier IC 41 is mounted on the first circuit substrate 17, and a flexible printed substrate 21 is used for connecting the head amplifier IC 41 and the signal line on the side of the arm 14 in order to allow natural functioning of the arm 14.

FIG. 19 is a schematic side cross-sectional view showing the hard disk drive 70 of FIG. 18 in an assembled condition.

As shown in FIG. 19, the platter 11, spindle motor 12, arm 14, voice coil motor 16, and the first circuit substrate 17 are all accommodated by the casing 18, and the opening of the casing 18 is shielded by the metal casing cover 19. Grooves (indentations) 18b, 18c are provided to the bottom surface of the casing 18 in order to house the bearing 15 for the arm and the spindle motor 12. The spindle motor 12 and arm bearing 15 are respectively housed and fixed in corresponding indentations 18b, 18c.

The first circuit substrate 17 is provided inside the casing 18 in regions other than those of the platter 11 or the like. The first circuit substrate 17 therefore has a long, thin irregular shape, and is not a simple rectangular substrate. As a result, the first circuit substrate 17 is provided in a small space inside the casing 18. The substrate surface area is therefore comparatively small, and the number of components that can be mounted is also limited. Consequently, a second circuit substrate 71 is required as another circuit substrate for mounting other circuits that cannot be mounted on the first circuit substrate.

The second circuit substrate 71 is provided outside the bottom surface of the casing 18, and the exposed surface thereof is shielded with a shielding plate 72. The depressions 18b, 18c which are the mounting sites for the spindle motor 12 and voice coil motor bearing 15 appear as protrusions when viewed from the back side of the casing 18, and the second circuit substrate 71 is provided to a region other than these protrusions. In other words, the second circuit substrate 71 is not a simple rectangular plate, but has a shape produced by punching out circles in the regions corresponding to the protrusions. The second circuit substrate 71 is connected to the first circuit substrate 17 via a connector 20.

The head amplifier IC 41 and peripheral components are primarily mounted on the first circuit substrate 17. The head amplifier IC 41 is an analog circuit, and has a read amplifier for data recording and a write driver for reading. These components are used for amplifying signals that have been read by the magnetic head and for amplifying the current used for the write signals. In order to minimize noise effects, the head amplifier IC 41 is preferably provided as close as possible from the head assembly, and is mounted on the first circuit substrate 17 for this reason.

A read/write channel IC, motor driver IC, hard disk controller IC, microcomputer IC, memory IC, and peripheral parts thereof are mounted on the second circuit substrate 71, and these ICs are connected by bus lines. The read/write channel IC decodes and modulates the write data and outputs the data to the head amplifier. Conversely, the data from the waveform that has been read, or the output signal from the head amplifier, is detected, encoded, and demodulated. The motor driver IC controls the spindle motor and the voice coil motor. The hard disk controller IC, as the name implies, is a circuit that controls the hard disk, and the components thereof include an error correction circuit, a buffer control circuit, a cache control circuit, an interface control circuit, and a servo circuit. The microcomputer IC controls the hard disk drive as a whole, and primarily carries out control of head position, interface control, peripheral LSI settings and initializations, and defect management.

FIG. 20 is a schematic external perspective view showing the structure of a mobile telephone that has the aforementioned hard disk drive 70, and depicts a condition in which the keypad has been removed.

As shown in FIG. 20, this mobile telephone 80 has a fold-up configuration, and the upper casing 51 and the lower casing 52 of the mobile telephone 80 are rotatably connected via a hinge 53. A main display 54 and camera 55 are provided to the upper casing 51. A main substrate 81 and antenna 59 are also accommodated in the lower casing 52. Although not shown in the drawing, a battery pack, speaker, and the like are housed in the bottom of the main substrate 81, and the hard disk drive 70 is also disposed therein. During actual use, the keypad 63 is attached to the top surface of the lower casing 52.

FIG. 21 is a schematic side cross-sectional view showing the internal structure of the mobile telephone 80.

As shown in FIG. 21, the interior of the upper casing 51 has a main display 54, camera 55, bottom surface display 56, and drive circuits (57) for these components. The interior of the lower casing 52, on the other hand, has a main substrate 81, an antenna 59, a battery pack 60, a speaker 61, a hard disk drive 70, and a keypad 63.

An RF component 58a, a power source 58b, an image processor 58c, and a baseband component 58d of the mobile telephone 80 are all components disposed on the main substrate 81 in the lower casing 52. The hard disk drive 70 is provided under this main substrate 81. The hard disk drive 70 and main substrate 81 of the mobile telephone 80 are connected via a flexible printed substrate 62.

The prior art related to wireless data terminals having hard disk drives has been described in various other documents such as Japanese Laid-open Patent Application 2004-362523 and 2001-285179.

As described above, the demand for smaller and thinner hard disk drives has been increasing, but platter sizes as well as the sizes of various motors and manufacturer parts are still difficult to make smaller, and thus novel designs involving different methods are required in order to achieve additional reductions in size and thickness of hard disk drives.

In addition, with conventional hard disk drives, numerous digital ICs have been mounted on the second circuit substrate 71, but when hard disk drives that are exposed to the external environment are mounted in mobile telephones unmodified and without shielding the second circuit substrate 71, the wireless circuits of the mobile telephone will be affected by high-frequency noise or unwanted radiation generated by the digital ICs or the bus lines that connect the circuits. As a result, there is the danger that the transmission quality of the mobile telephone will be impaired. In particular, this interference will have a significant influence on reception sensitivity of mobile telephones that use frequency spread coding such as CDMA.

As shown in FIGS. 18 and 19, it is possible to individually shield the wireless circuits on the mobile telephone by a means such as shielding the second circuit substrate 71 using a metal plate 72, but because parts that are susceptible to the influence of noise are each shielded in extremely small and thin mobile telephones, it is difficult to additionally reduce the thickness of the mobile telephones.

Moreover, although multiple digital ICs constitute the baseband component 58d of the mobile telephone 80, the noise that is generated by the baseband component 58d exerts a detrimental influence on the RF component 58a and the power source 58b in the mobile telephone. Frequency spread formats such as CDMA (code division multiple access) are particularly susceptible to in-band noise, and thus effects on mobile telephones that employ frequency spread coding are extreme.

SUMMARY OF THE INVENTION

It is therefore a first object of the present invention to provide a small, thin hard disk drive whereby noise can be suppressed.

In addition, a second object of the invention is to provide a wireless data terminal that has a hard disk drive that is small, thin, and has favorable transmission quality.

The above and other objects of the present invention can be accomplished by a hard disk drive comprising a platter, a spindle motor for driving the platter, an arm with a magnetic head attached to a distal end thereof, a voice coil motor for driving the arm, a first circuit substrate, and a drive casing for accommodating and electrically shielding the platter, spindle motor, arm, voice coil motor, and first circuit substrate, wherein the first circuit substrate has a multilayer substrate, a plurality of digital ICs that is embedded as bare chips in the multilayer substrate, and a bus line for connecting the digital ICs, and the digital ICs are disposed in a mutually horizontal configuration.

In a preferred aspect of the present invention, the hard disk drive further comprises first and second ground layers for respectively covering the top and bottom of a bus line. The digital ICs preferably contain a read/write channel IC and a motor driver IC. The digital ICs also preferably contain a system LSI having a hard disk controller, microprocessor, and memory as components.

In a preferred aspect of the present invention, electronic components are mounted on at least one surface selected from the top surface and bottom surface of the multilayer substrate. The electronic components may contain chip parts of passive component, analog ICs such as a head amplifier IC, and digital ICs different from the plurality of digital ICs that is embedded in the multilayer substrate.

In a preferred aspect of the present invention, the passive component is a chip capacitor. One terminal of the chip capacitor is connected with the bus line, and another terminal is connected with the first or second ground layer, thereby forming a bypass capacitor.

In a preferred aspect of the present invention, the multilayer substrate has a plurality of layered insulating layers and wiring layers provided between the plurality of insulating layers, and part of the wiring layer constitutes the bus line.

In a preferred aspect of the present invention, the first ground layer is formed on the top surface of the multilayer substrate, and the second ground layer is formed on the bottom surface of the multilayer substrate.

In a preferred aspect of the present invention, the digital IC and bus line are substantially directly connected via conductive protrusions.

In a preferred aspect of the present invention, all of the signal lines that constitute the bus line are provided to the same wiring layer. In another preferred aspect of the preferred invention, part of a signal line that constitutes the bus line and is a part that intersect with at least another signal line is provided to a layer that is different from the wiring layer.

In a preferred aspect of the present invention, at least one insulating layer selected from the insulating layer that is in contact with the top and bottom surface of the bus line is configured to include a ferromagnetic material.

In a preferred aspect of the present invention, the hard disk drive further comprises a shielding member disposed in a region between a digital circuit region having the digital ICs, and an analog circuit region provided to the same layer as the digital circuit region. In a further preferred aspect of the present invention, the shielding member is a via-hole electrode for connecting the first and second ground layers.

In the present invention, the first and second ground layers are preferably formed separately as a digital-side ground region for covering a digital circuit region having the digital ICs, and an analog-side ground region for covering an analog circuit region provided to the same layer as the digital circuits.

In a preferred aspect of the present invention, the hard disk drive further comprises a thermal via that is connected to the bottom surfaces of the digital ICs embedded in the multilayer substrate.

In a preferred aspect of the present invention, the hard disk drive further comprises an external interface provided to the first circuit substrate, and a filter circuit provided on a line connected to the external interface.

The above and other objects of the present invention can be accomplished by a wireless data terminal comprising at least an antenna, an RF component connected to the antenna, a baseband component connected to the RF component, the hard disk drive as claimed in claim 1, and a terminal casing for accommodating the RF component, the baseband component, and the hard disk drive, wherein the hard disk drive further has a second circuit substrate that is provided to the external surface of the terminal casing and is electrically connected to the first circuit substrate, and a shielding member for covering the exposed surface of the second circuit substrate, and wherein at least the baseband component is formed on the second circuit substrate.

In a preferred aspect of the present invention, the antenna is provided to the interior of the terminal casing.

In a preferred aspect of the present invention, the wireless data terminal further comprises an image processor for processing image data, and a display for displaying image data, wherein the image processor is also formed on the second circuit substrate.

The above and other objects of the present invention can be accomplished by a wireless data terminal comprising at least an antenna, an RF component connected to the antenna, a baseband component connected to the RF component, a hard disk drive for recording various types of data, and a terminal casing for accommodating the RF component, the baseband component, and the hard disk drive, wherein the hard disk drive further has a platter, a spindle motor for driving the platter, an arm with a magnetic head attached to a distal end thereof, a voice coil motor for driving the arm, a first circuit substrate on which the hard disk drive control circuits are formed, a drive casing that for accommodating and electrically shielding the platter, spindle motor, arm, voice coil motor, and first circuit substrate, a second circuit substrate that is provided to the outer surface of the drive casing and is electrically connected to the first circuit substrate, and a shielding member for covering the exposed surface of the second circuit substrate, and wherein at least the baseband component is formed on the second circuit substrate.

According to the present invention, it is possible to realize high-density mounting by using multilayer substrates for the circuit substrate that is provided inside the casing of the hard disk drive, and embedding a number of the digital Ics in the multilayer substrate in a bare-chip condition. As a result, it is not necessary to use a second circuit substrate outside the casing, as has been required in the past. Moreover, a plurality of digital ICs is disposed horizontally with respect to each other, without being layered in the vertical direction, thereby allowing the ICs to be directly connected without the use of via-hole electrodes as interlayer connection means. Therefore, it is possible to dispose the bus lines for connecting the digital ICs at minimal distance, thereby allowing a reduction in high-frequency noise generated by the bus lines. In addition, by covering the top and bottom of the bus line with first and second ground layers, it is possible to sufficiently reduce the influence of noise generated by the bus lines on the peripheral circuits, particularly the analog circuits.

In addition, by means of the present invention, a small, thin wireless data terminal with favorable transmission quality can be offered that has a hard disk drive.

BRIEF DESCRIPTION OF THE DRAWINGS

The above and other objects, features and advantages of this invention will become more apparent by reference to the following detailed description of the invention taken in conjunction with the accompanying drawings, wherein.

Figure 12A:
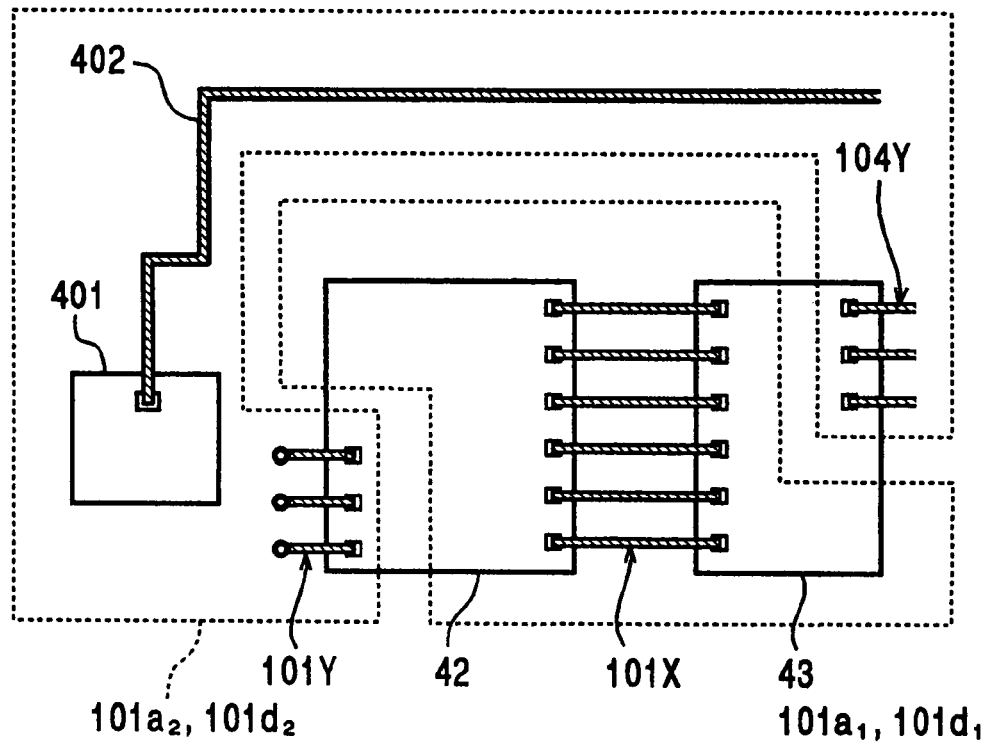
Figure 12B:
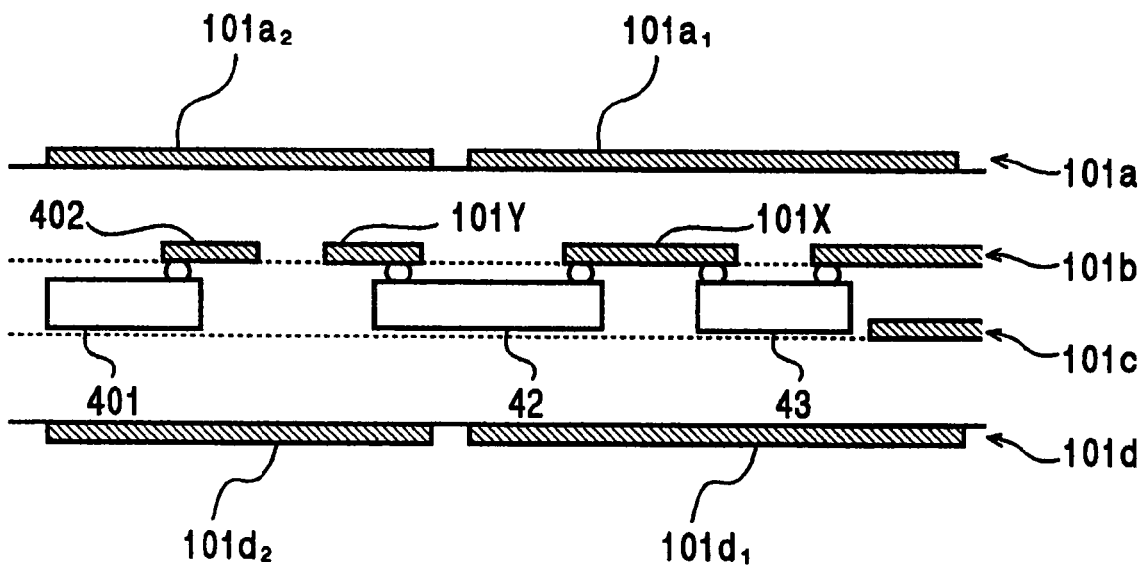
Figure 13:
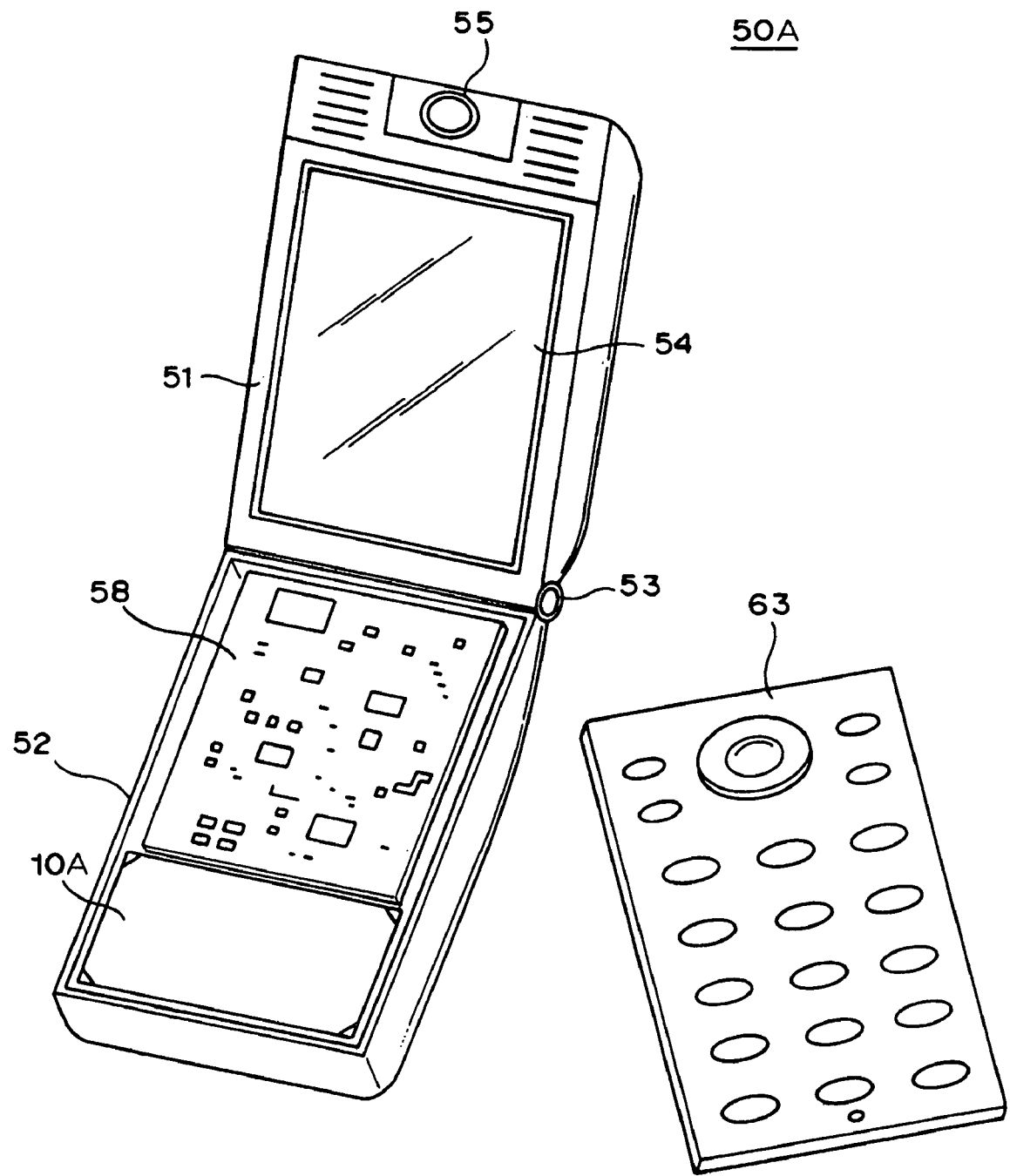
Figure 14:
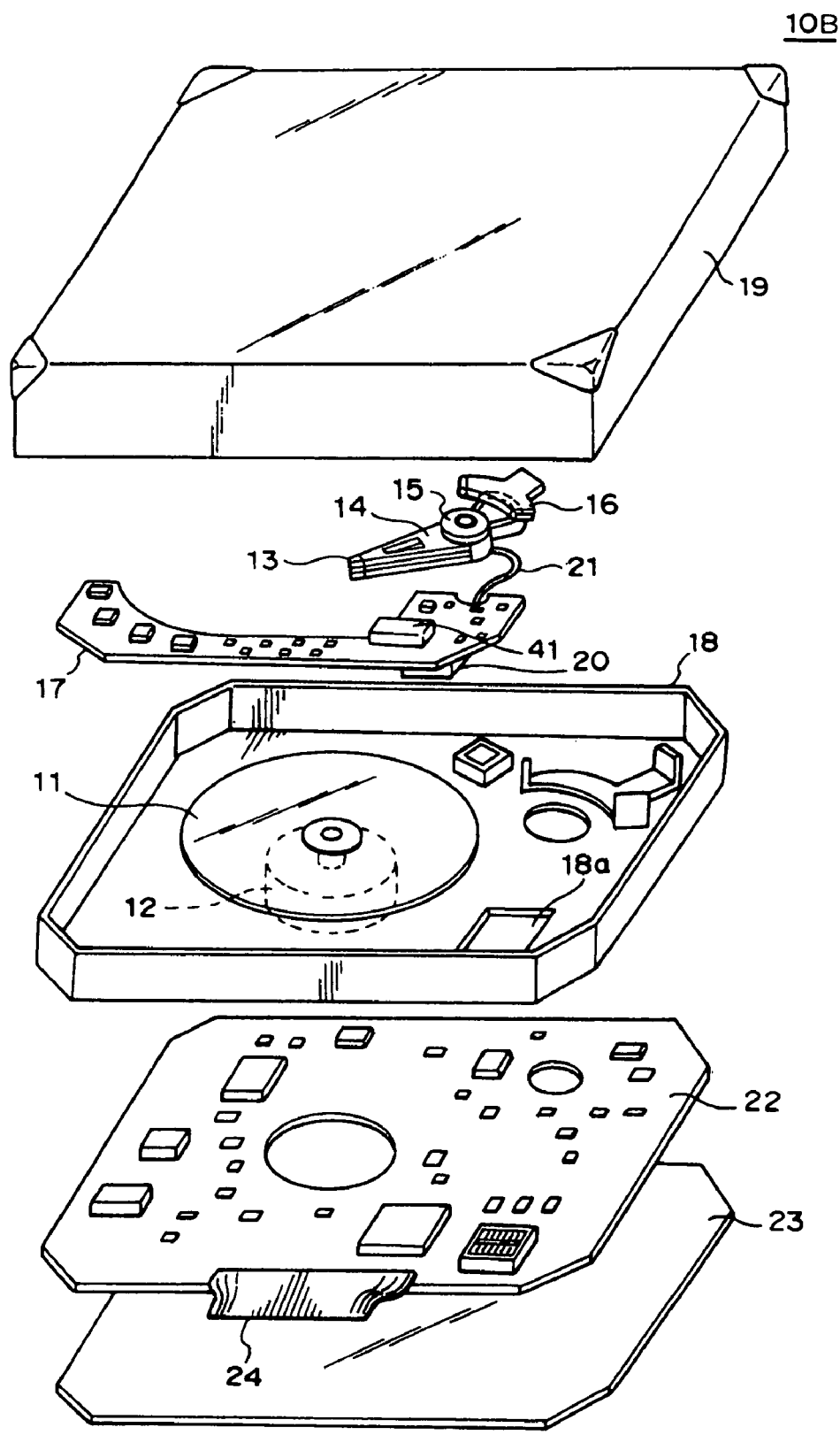
Figure 15:
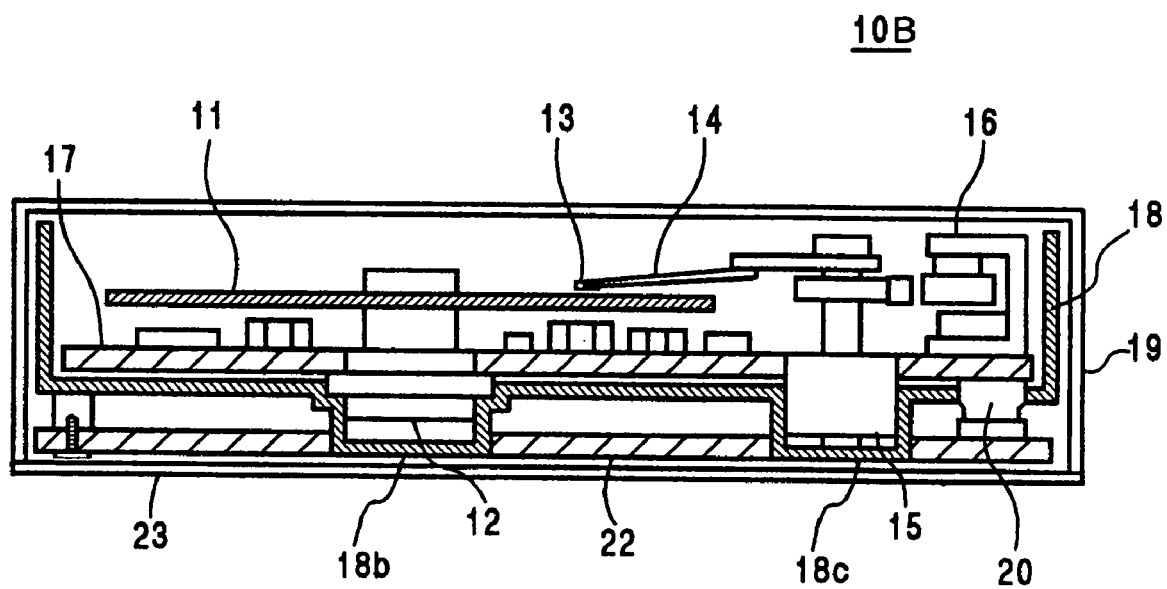
Figure 16:
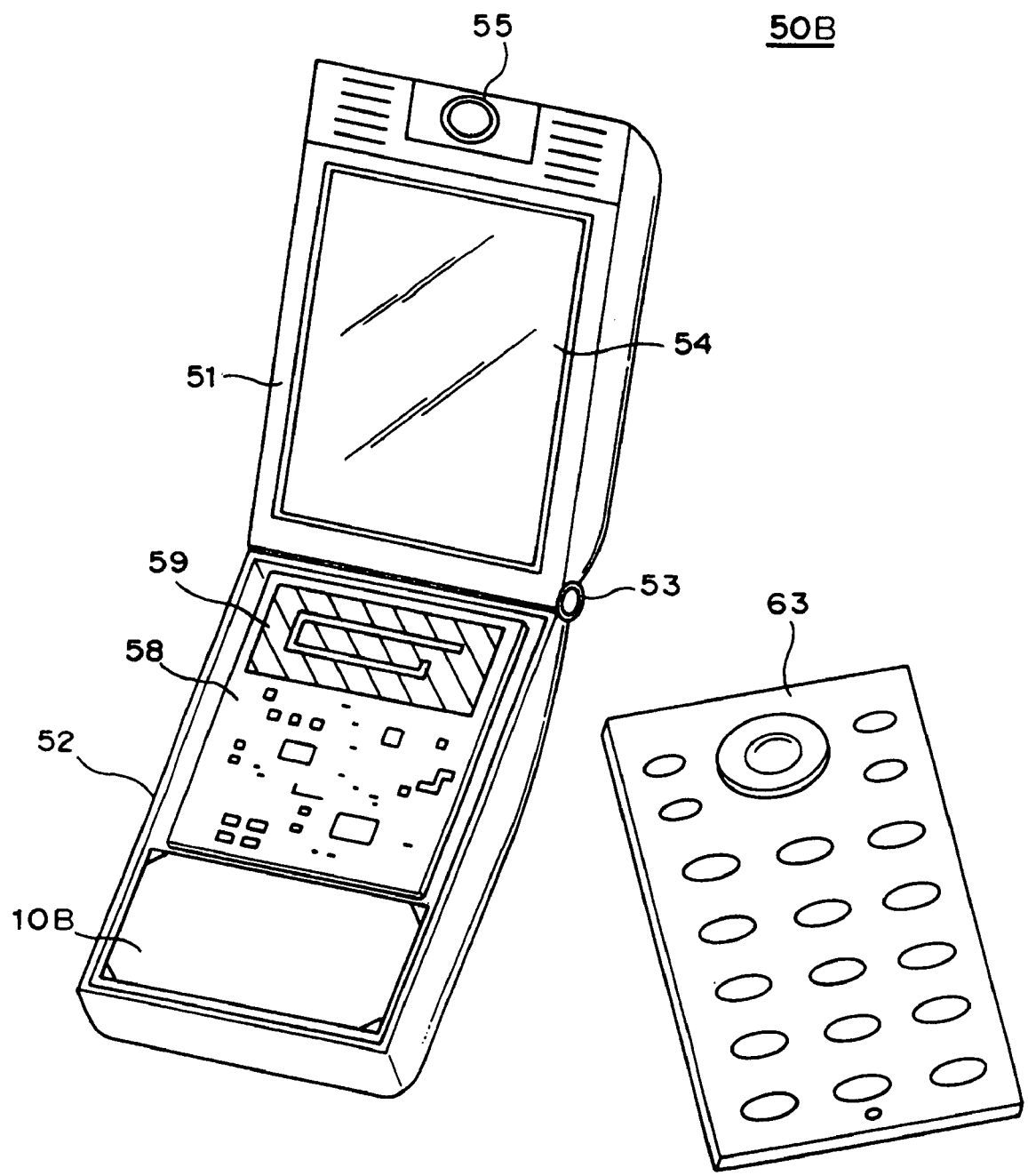
Figure 17:
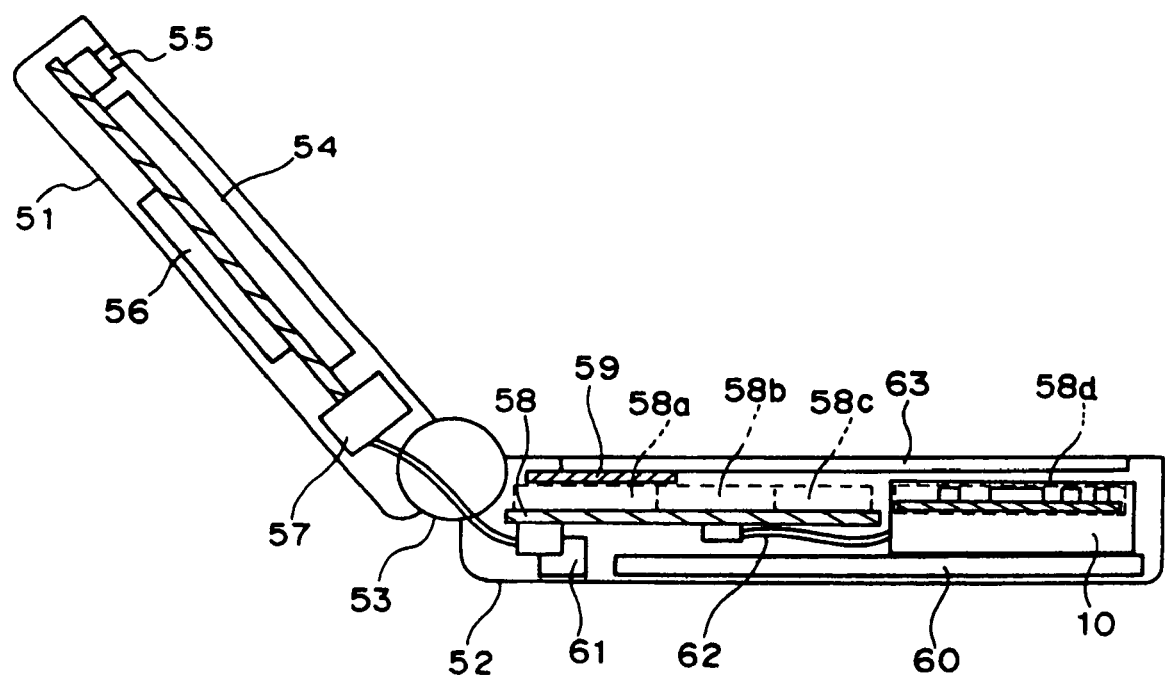
Figure 18:
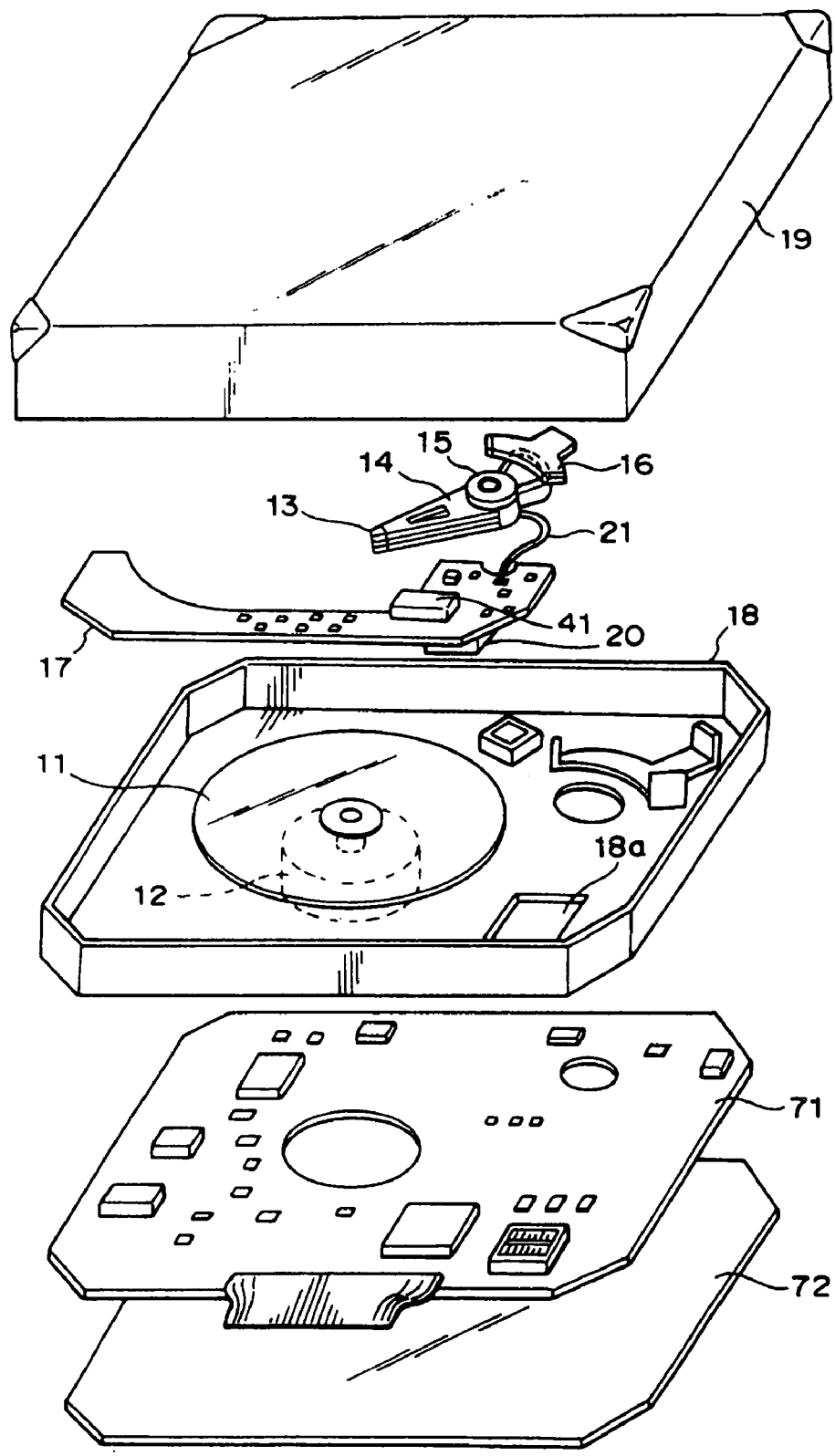
Figure 19:
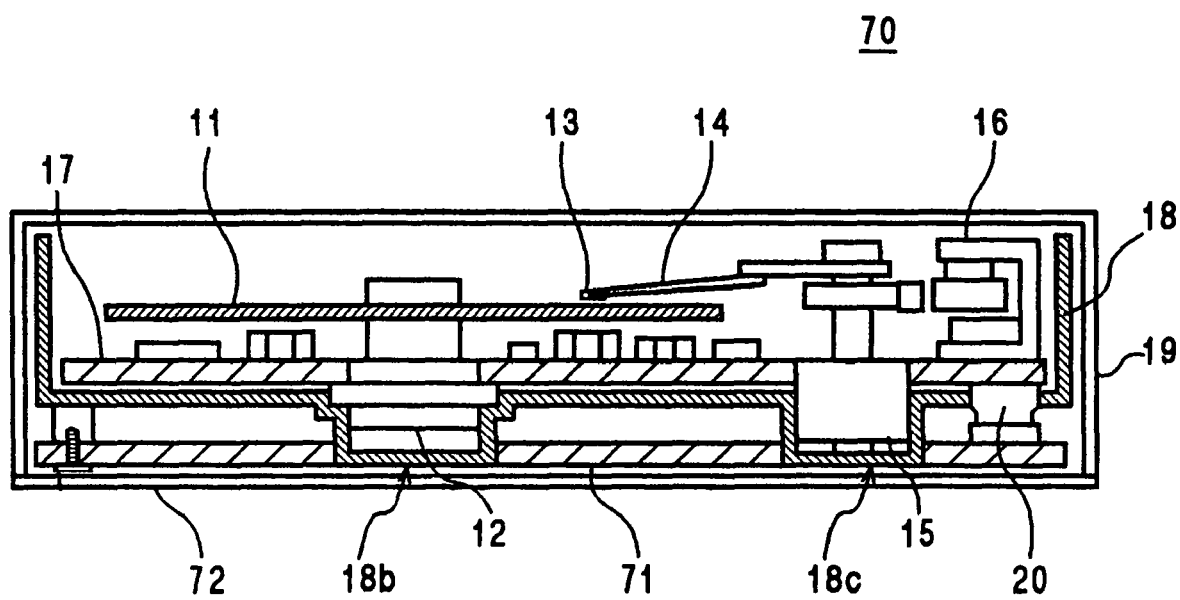
Figure 20:
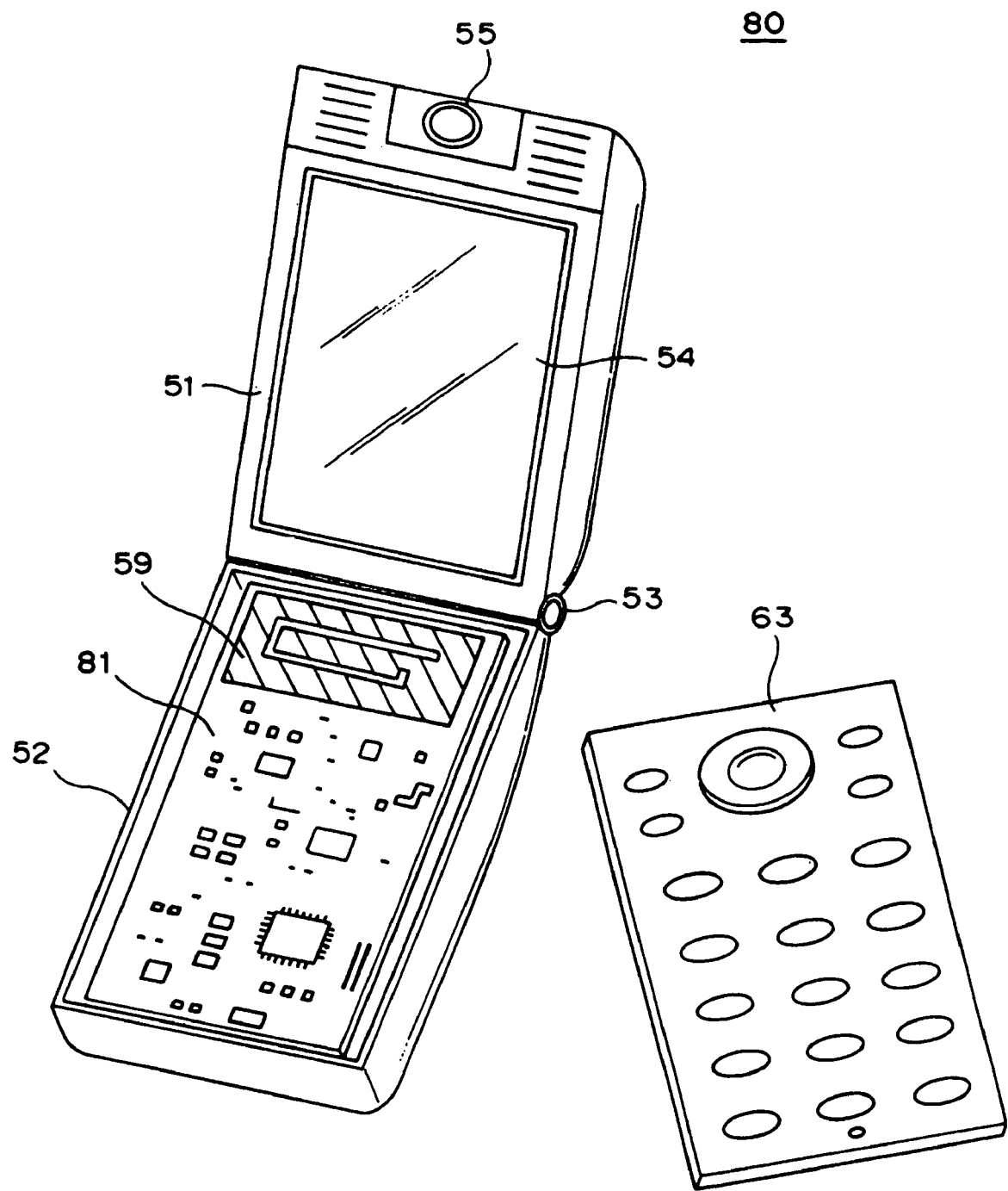
Figure 21:
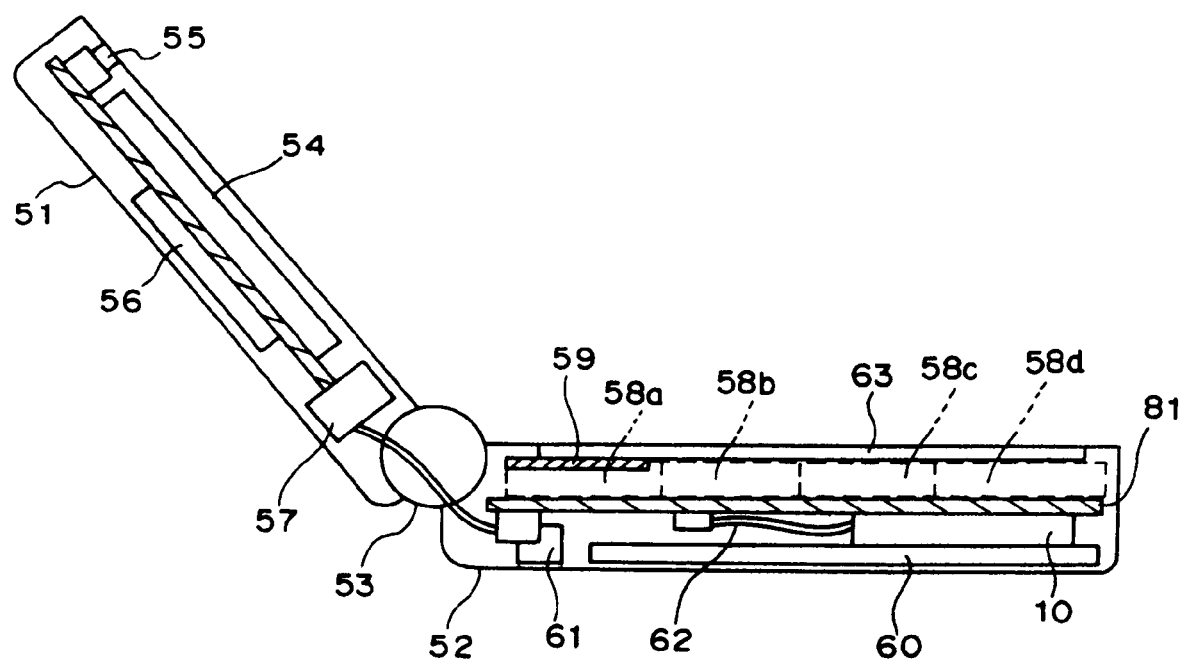

11B is a schematic cross-sectional view showing yet another example of the structure of the first circuit substrate 17;

FIG. 12A is a schematic plan view that show yet another example of the structure of the first circuit substrate 17;

FIG. 12B is a schematic cross-sectional view that shows yet another example of the structure of the first circuit substrate 17;

FIG. 13 is a schematic external perspective view showing the structure of the mobile telephone that has the aforementioned hard disk drive 10A, and depicts a configuration in which the keypad has been removed;

FIG. 14 is an exploded perspective view that schematically shows the structure of the hard disk drive according to another preferred embodiment of the present invention;

FIG. 15 is a schematic side view that shows the assembled condition of the hard disk drive 10B of FIG. 14;

FIG. 16 is a schematic external oblique view showing the structure of the mobile telephone in which the aforementioned hard disk drive 10B has been installed, and depicts the condition in which the keypad has been removed;

FIG. 17 is a schematic side cross-sectional view showing the internal structure of the mobile telephone 50B;

FIG. 18 is a schematic exploded perspective view showing the structure of a conventional hard disk drive;

FIG. 19 is a schematic side cross-sectional view showing the hard disk drive 70 of FIG. 18 in an assembled condition.
FIG. 20 is a schematic external perspective view showing the structure of a mobile telephone that has the aforementioned hard disk drive 70, and depicts a condition in which the keypad has been removed;

FIG. 21 is a schematic side cross-sectional view showing the internal structure of the mobile telephone 80.

DETAILED DESCRIPTION OF THE EMBODIMENTS

A preferred embodiment of the present invention will now be described in detail hereinafter with reference to the accompanying drawings.

Figure 1:
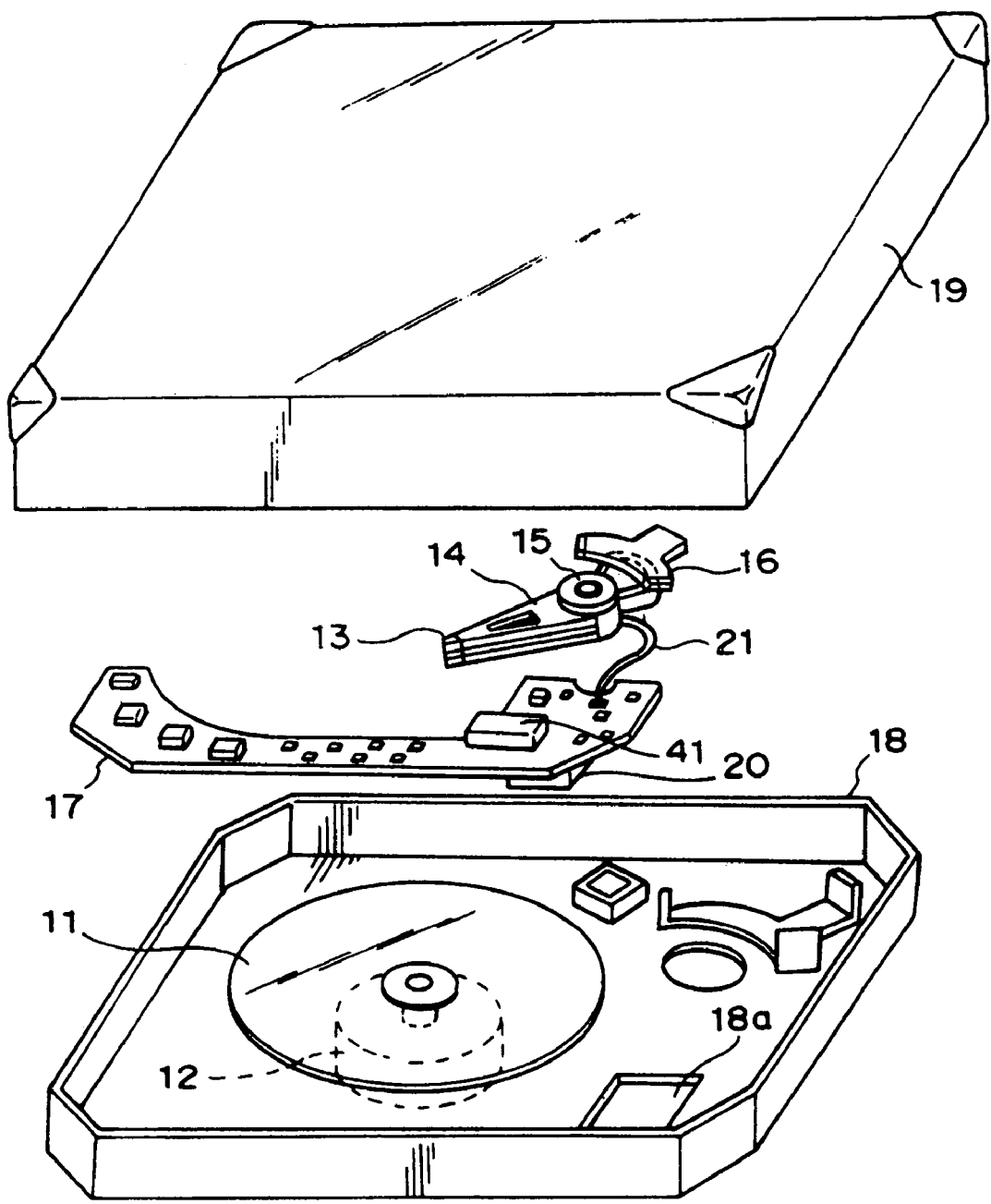
FIG. 1 is an exploded perspective view that schematically shows the structure of the hard disk drive according to a preferred embodiment of the present invention.

FIG. 1 is an exploded perspective view that schematically shows the structure of the hard disk drive according to a preferred embodiment of the present invention.

As shown in FIG. 1, this hard disk drive 10A has a platter 11 that is a recording medium, a spindle motor 12 for rotatably driving the platter 11, an arm 14 with a magnetic head 13 attached to a distal end thereof, a bearing 15 that supports the rear end of the arm 14, a voice coil motor 16 for slidably driving the arm 14, a first circuit substrate 17 that constitutes each of the functional block control circuits, a metal casing 18 (drive casing) for accommodating and electrically shielding these components, and a metal casing cover 19. The first circuit substrate 17 has a connector 20, and a lead opening 18a for bringing out the connector 20 from the casing is formed in the bottom surface of the casing 18. A head amplifier IC 41 is mounted on this first circuit substrate 17, and a flexible printed substrate 21 is used for connecting the head amplifier IC 41 and the signal line of the arm 14 in order to allow natural movement of the arm 14.

The connector 20 constitutes the external interface of the hard disk drive 10A. The term "external interface" used herein refers to the interface whereby the circuits inside the hard disk drive 10A are connected with external circuits. In this embodiment, it is preferable to provide a filter circuit on the eternal interface connection line, although this circuit is not shown in the drawings. Even if the first circuit substrate 17 is shielded by the casing 18, the completely shielded structure produced by the casing 18 is useless when noise is superposed on the line connecting to the external interface. However, by providing a filter circuit on the external interface connection line, it is possible to maximize the shielding effect.

Figure 2:
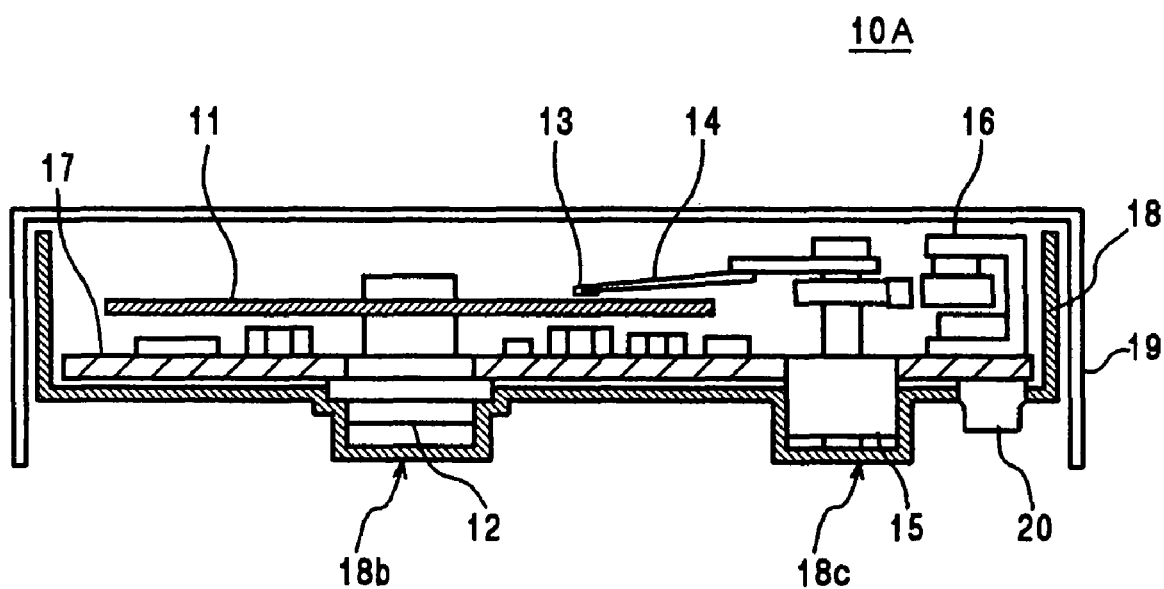
FIG. 2 is a schematic side cross-sectional view showing a condition in which the hard disk drive 10A of FIG. 1 has been assembled.

FIG. 2 is a schematic side cross-sectional view showing a condition in which the first hard disk drive 10A has been assembled.

As shown in FIG. 2, a platter 11, spindle motor 12, arm 14, voice coil motor 16, and first circuit substrate 17 are housed in the casing 18. The opening of the casing 18 is shielded by a casing cover 19. Grooves (indentations) 18b and 18c are provided to the bottom surface of the casing 18 for housing the spindle motor 12 and arm bearing 15, and the spindle motor 12 and arm bearing 15 are housed and fixed in the corresponding indentations 18b and 18c. The depressions 18b, 18c appear as protrusions when viewed from the back side of the casing 18. In the past, a second circuit substrate has been provided to the back side region of the casing 18 outside the protruding regions, but this circuit substrate is not necessary in this embodiment.

Figure 3:
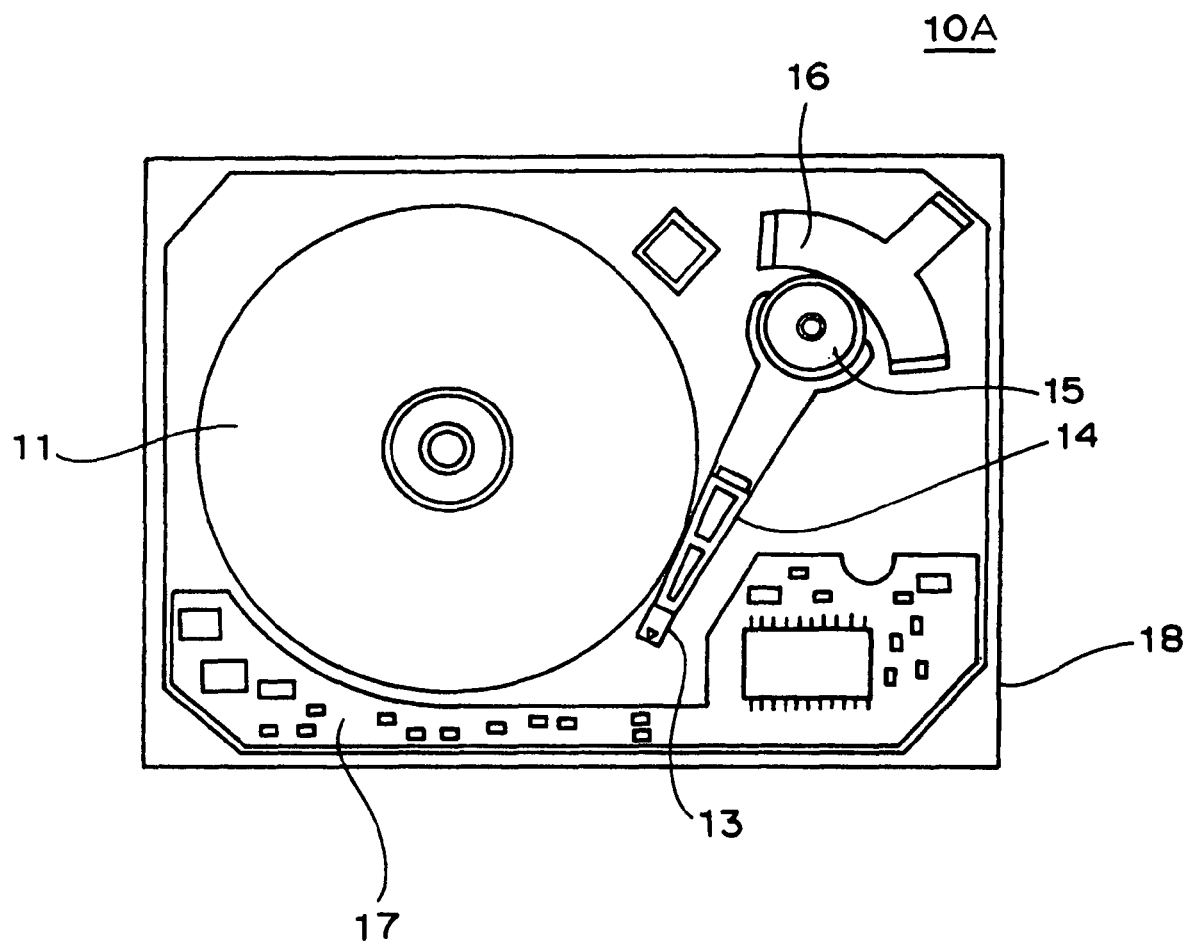
FIG. 3 is a schematic plan view showing the structure of the hard disk drive 10A.

FIG. 3 is a schematic plan view showing the structure of the hard disk drive 10A.

As shown in FIG. 3, the first circuit substrate 17 is provided to the casing 18 in a region other than the region for the platter 11 or the like. Consequently, the first circuit substrate 17 is not a simple rectangular substrate, but has a narrow nonuniform shape. In this manner, the circuit substrate 17 is provided in a small space within the casing 18, and thus the substrate surface area is relatively small. However, in this embodiment, a multilayer substrate is used as the first circuit substrate 17, and the digital ICs that are to be mounted thereupon are embedded inside the substrate as bare chips, so that the required circuit configuration is realized using only the first circuit substrate 17. All of the ICs and peripheral components thereof required for the hard disk drive configuration, rather than the head amplifier IC 41 alone, are mounted in the first circuit substrate 17.

Figure 4:
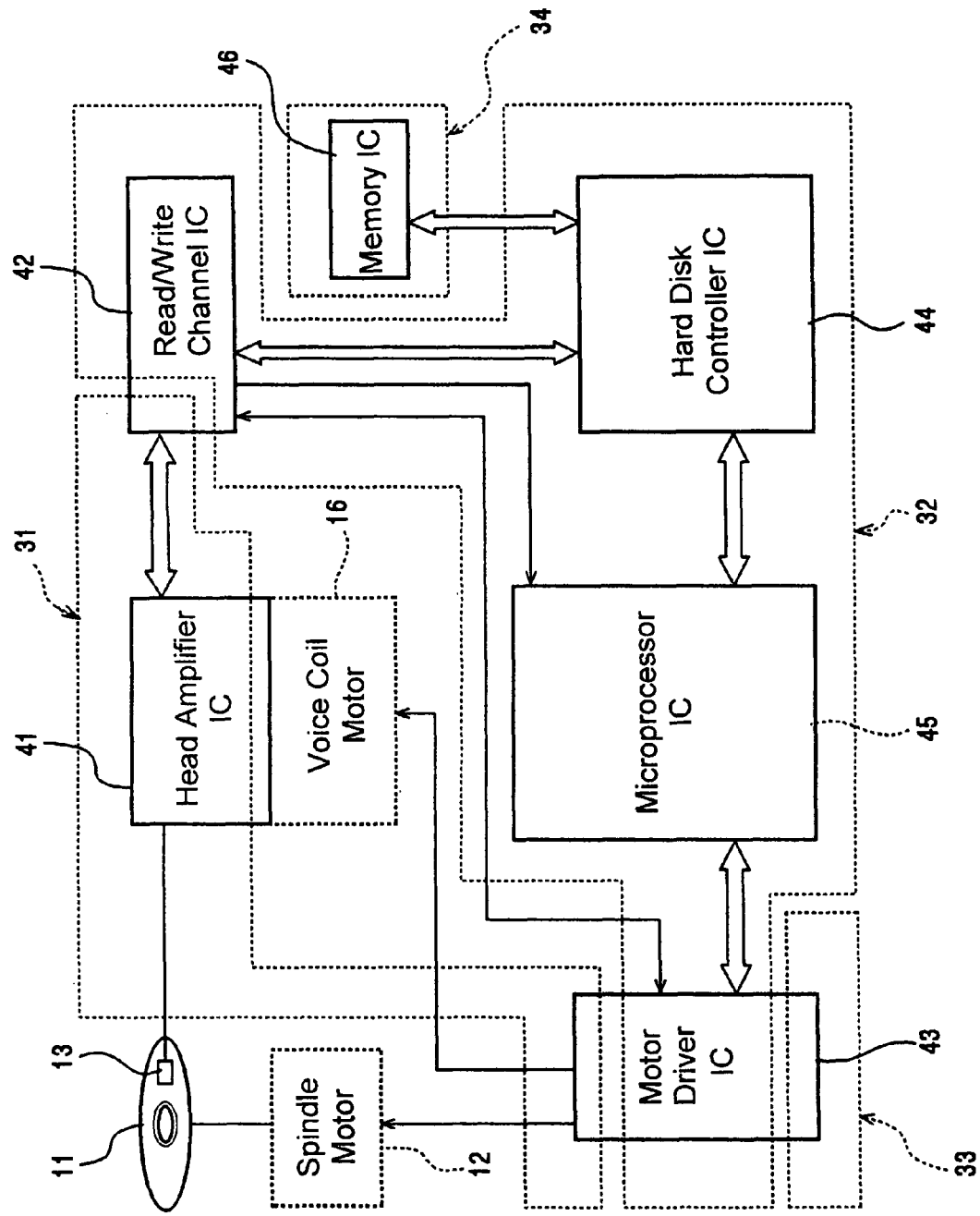
FIG. 4 is a block diagram that shows the circuit configuration of the hard disk drive 10A.

FIG. 4 is a block diagram that shows the circuit configuration of the hard disk drive 10A.

As shown in FIG. 4, the circuits of the hard disk drive 10A are generally divided into four circuit blocks, i.e., the analog circuits 31 for controlling signal processing and the motor; the logic circuits 32 for performing microcomputer tasks, error correction and various control functions; the power circuits 33 that drive the motor; and the memory 34 that is used for data buffering or programs. These circuit blocks are realized by a head amplifier IC 41, a read/write channel IC 42, a motor driver IC 43, a hard disk controller IC 44, a microprocessor IC 45, a memory IC 46, and peripheral components for these ICs.

Of these circuits, the analog circuit 31 is constituted by the head amplifier IC 41, part of the read/write channel IC 42, and part of the motor driver IC 43. The logic circuit 32 is constituted by part of the read/write channel IC 42, part of the motor driver IC 43, the hard disk controller IC 44, and the microprocessor IC 45. The power circuit 33 is constituted by part of the motor driver IC 43. The memory 34 is constituted by the memory IC 46. The read/write channel IC 42 and the motor driver IC 43 partially include analog circuits, but most of these ICs are digital circuits. Consequently, of these ICs, the head amplifier IC 41 is the only purely analog IC. The other ICs (read/write channel IC 42, motor driver IC 43, hard disk controller IC 44, microprocessor IC 45, and memory IC 46) are classified as digital ICs.

The head amplifier IC 41 has a write driver for reading and a read amplifier for data recording, and amplifies the signals that have been read by the magnetic head 13, or amplifies the current of the write signals. In order to dramatically reduce the effects of noise, the head amplifier IC 41 is preferably provided as close as possible from the head assembly, and is thus mounted on the first circuit substrate 17.

The read/write channel IC 42 decodes and modulates the write data and outputs the data to the head amplifier, but also detects playback waveform that has been read, i.e., the data from the head amplifier output signal, and encodes and demodulates the data. As stated above, the read-write channel IC 42 partially includes analog circuits, but has mostly digital circuits. The motor driver IC 43 controls the spindle motor 12 and voice coil motor 13. The motor driver IC 43 also partially has analog circuits, but is mostly digital circuits. The hard disk controller IC 44, as implied by the name, is a circuit that controls the hard disk, and has components that include error correction circuits, .buffer controller circuits, cache control circuits, interface control circuits, and servo circuits. The microprocessor IC 45 governs control of the hard disk drive as a whole, and primarily carries out head positioning control, interface control, setting and initialization of peripheral LSI circuits, and defect management.

Figure 5:
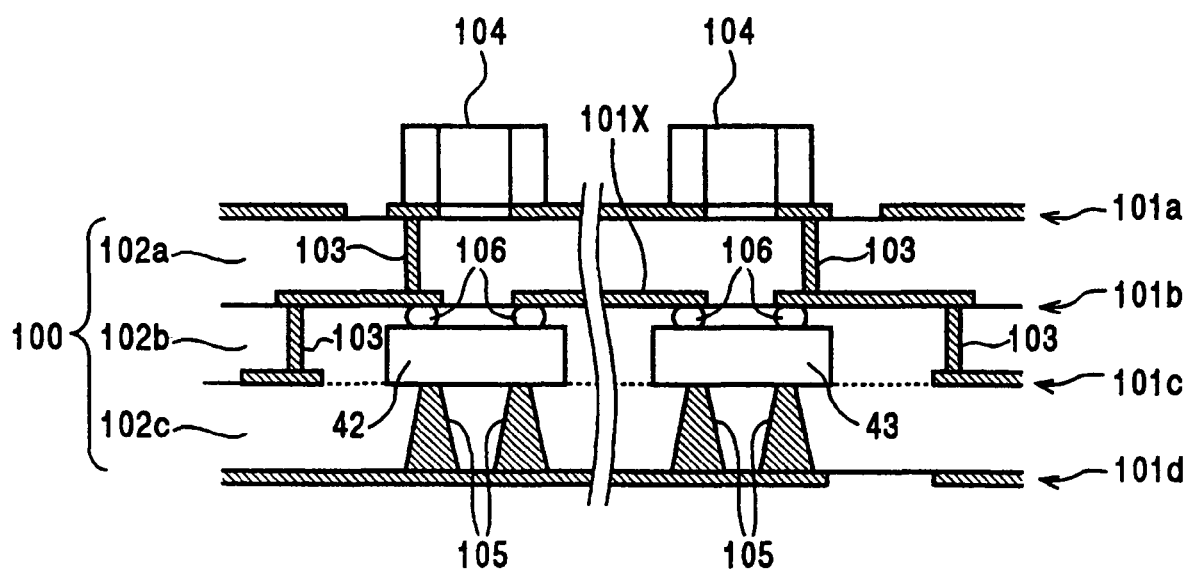
FIG. 5 is a partial cross-sectional view that schematically shows the structure of the first circuit substrate 17.

FIG. 5 is a partial cross-sectional view that schematically shows the structure of the first circuit substrate 17.

As shown in FIG. 5, a multilayer substrate 100 is used for the first circuit substrate 17. The multilayer substrate 100 in this embodiment has, for example, a four-layer structure, where the first (outermost) conductive layer is primarily a first ground layer 101a, the second layer (internal layer) is primarily a wiring layer 101b, the third layer (internal layer) is primarily a power layer 10c, and the fourth layer (outer layer) is primarily a second ground layer 101d. Insulating layers 102a, 102b, and 102c are provided as interlayers for each of the conductive layers 101a to 101d. Via-hole electrodes 103 are provided that pass through the insulating layers 102a to 102c, as necessary.

A number of the digital ICs that is mounted on the first circuit substrate 17 are embedded in the multilayer substrate 100 as bare chips. In this embodiment, as shown in the drawings, a read/write channel IC 42 and a motor driver IC 43 are embedded in the substrate. The other digital ICs are not shown in the drawing, but are mounted on the surface of the multilayer substrate 100. In addition, as shown in the drawings, passive elements such as R, L, and C components or chip parts 104 of other elements are mounted on the surface of the multilayer substrate 100. Moreover, a thermal via 105 is provided below the digital ICs 42 and 43 that are embedded in the substrate, and the thermal via 105 ensures a radiant heat pathway by connecting with the second ground layer 101*d*.

Part of the wiring layer 101*b* is composed of a bus line 101X for connecting the read/write channel IC 42 and motor driver IC 43. The bus line 101X, for example, is a signal line that transmits digital signals having a relatively high voltage of 5 V or 3.3 V at high clock speeds of 100 MHz. As the length of the bus line increases, the effects of the high-frequency noise generated by the bus line 101X increase as well, which usually has detrimental effects on analog circuits in wireless systems, e.g., produces a decrease in reception sensitivity in mobile telephones. However, in this embodiment, the digital ICs are embedded as bare chips, thereby minimizing the wiring length for the bus line 101X; the first and second ground layers 101*a* and 101*d* are formed on the outer layer (surface) of the multilayer substrate 101; and the top and bottom of the bus line 101*x* is shielded by ground layers. It is therefore possible to sufficiently suppress the effects of noise generated by the bus line 101X on peripheral circuits, particularly analog circuits. In order to enhance shielding effects, it is desirable for the first and second ground layers 101*a* and 101*d* to cover as broad an area as possible at the periphery of the bus line 101X.

Figure 6A:
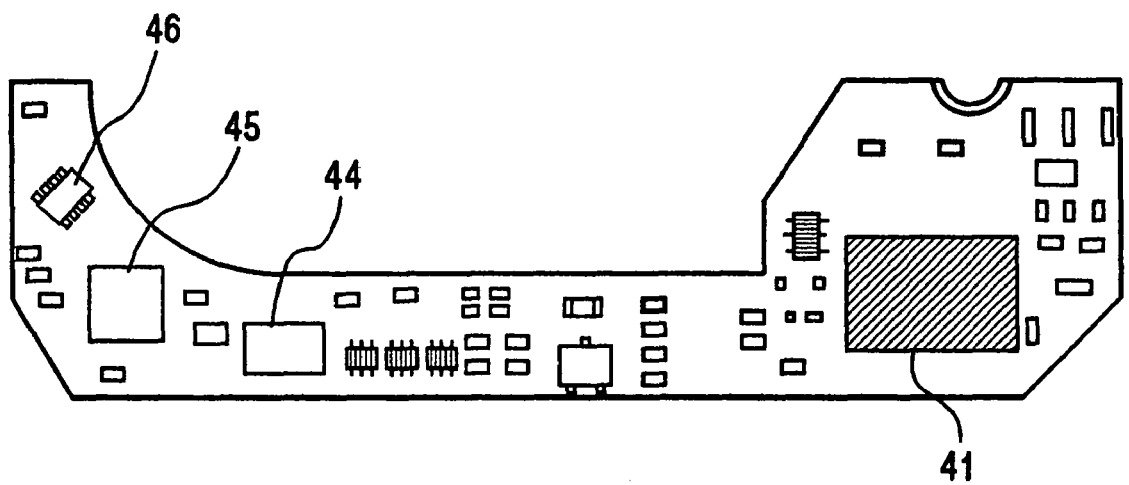
FIG. 6A is a schematic a plan view showing the layer structure of the first circuit substrate 17, specifically showing the structure of the substrate surface (first ground layer 101a)
Figure 6B:
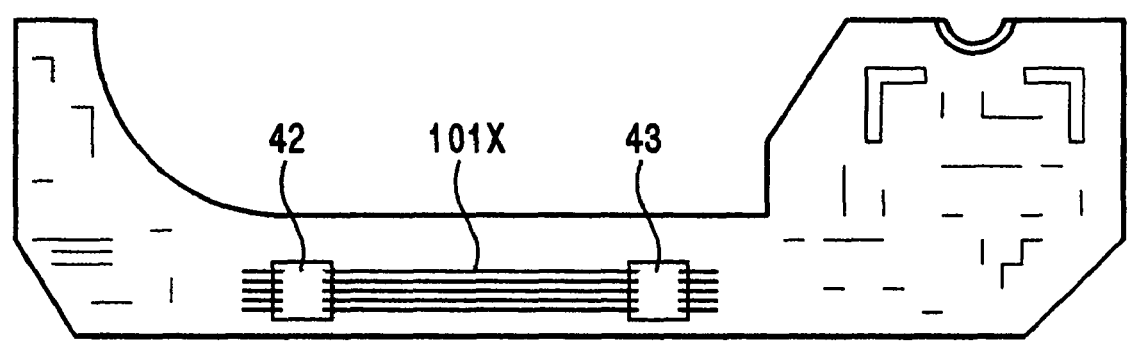
FIG. 6B is a schematic cross-sectional view showing the layer structure of the first circuit substrate 17, specifically showing the structure of the inner layer (wiring layer 101b)

FIG. 6 is a schematic plan view showing the layer structure of the first circuit substrate 17, where FIG. 6A is a plan view showing the structure of the substrate surface (first ground layer 101*a* and FIG. 6B is a schematic cross-sectional plan view showing the structure of the inner layer (wiring layer 10*b*).

As shown in FIG. 6A, numerous electronic components are mounted on the surface of the first circuit substrate 17, and the head amplifier IC 41, hard disk controller IC 44, microprocessor IC 45, and memory IC 46 are also mounted on the substrate surface. Most of the surface of the first circuit substrate 17 constitutes the first ground layer 101*a*, i.e., the ground surface, and partially constitutes a land pattern for the mounting of the electronic parts. Electrical connections with these electronic parts are made using via-hole electrodes 103 and a wiring layer 101*b*. As shown in FIG. 6B, on the other hand, a read/write channel IC 42 and motor driver IC 43 are provided to the inner layer of the first circuit substrate 17. Most of the wiring layer 101*b* is configured as wiring for connecting the parts that are mounted on the substrate surface, but part of the first wiring layer 101*b* is configured as the bus line 101X for connecting the read/write channel IC 42 and motor driver IC 43, as shown in the drawings.

As shown in FIG. 5, connections between the pad electrodes of IC chips 42 and 43 and the bus line 101X are not made using via-hole electrodes; rather, substantially direct connections are made using bumps or other conductive protrusions 106. This is because impedance control is difficult to accomplish when the bus line 101X is configured using via-hole electrodes, and also because problems such as tendency for noise generation can be eliminated. In addition, the read/write channel IC 42 and motor driver IC 43 have both analog circuits and digital circuits, but when, for example, the signal lines that connect with the pad electrodes of the read/write channel IC 42 are configured using via-hole electrodes, the via-hole electrodes that are components of these signal lines are disposed in parallel and in the vicinity of each other. As a result, interference with the analog signal lines by the digital signal lines becomes a problem. However, if the semiconductor IC pad electrodes and bus line are substantially directly connected, bus line impedance becomes easy to control, and it is possible to minimize interference between the analog and digital circuits by disposing neighboring signal lines so that they are not parallel to each other, or by providing a shielding means.

In addition, in this embodiment, the read/write channel IC and motor driver IC are disposed horizontally with respect to each other, and the IC terminals are directly connected by the bus line 101X. For example, when IC chips are layered vertically, it is necessary to use via holes as the interlayer connection means for parts of the bus line that connect the semiconductor ICs, and thus a large amount of space is required for the bus line region, making it difficult to control bus line impedance. In addition, the effects of high-frequency noise are increased because of the long wiring distance of the bus line. In the present embodiment, however, it is not necessary to use via-hole electrodes as components of the bus line. It is therefore possible to minimize the wiring distances of the bus line 101X in the manner shown in FIGS. 5 and 6, and to reduce noise generated by the bus line 101X.

As described above, by means of this embodiment, it is possible to achieve high-density mounting by using a multilayer substrate 100 for the first circuit substrate 17 provided to the casing of the hard disk drive, and by embedding a number of the digital ICs as bare chips in the multilayer substrate 100. Therefore, a second circuit substrate that has heretofore been required outside the casing can be made unnecessary. Moreover, high-frequency noise generated by the bus line 101X can be reduced because the bus line 101X that connects the digital ICs can be produced with minimal wiring. In this case, all circuits, including the circuits that are sources of noise such as bus lines as well as circuits that are susceptible to noise, can be configured on a single circuit substrate. However, by covering the top and bottom of the bus line 101X with first and second ground layers 101*a* and 101*d*, the noise that is generated by the bus line 101X is sufficiently inhibited in its effect on the peripheral circuits, particularly the analog circuits.

Figure 7A:
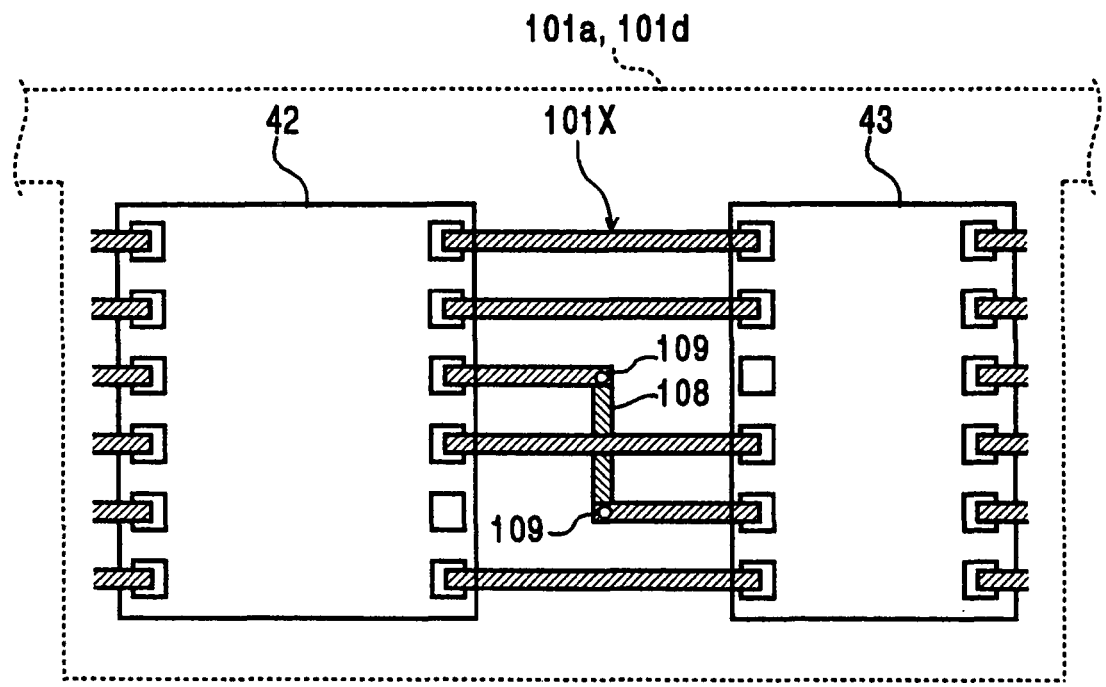
FIGS. 7A is a schematic plan view showing another example of the structure of the bus line 101X.
Figure 7B:
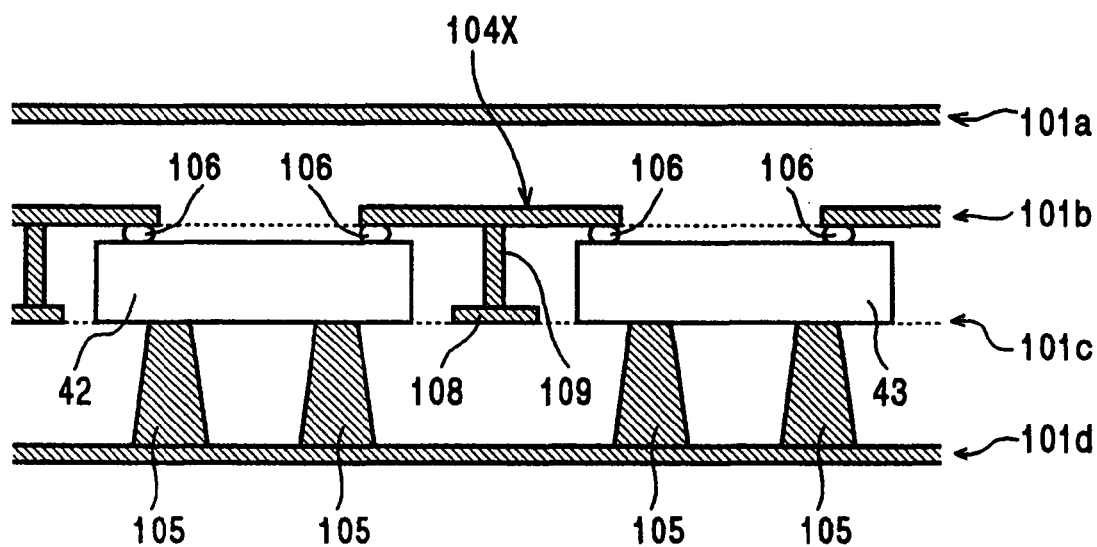
FIGS. 7B is a schematic cross-sectional view showing another example of the structure of the bus line 101X.

The bus line 101X is preferably formed in a single layer without using other conductive layers, but, in cases where efficient wiring is not possible unless a signal line present in the bus line 101 intersects with another signal line, then, for example, part of this bus line 101X may be formed in the power layer 101*c*, including the region 108 where an intersection is formed with the other signal line, as shown in FIGS. 7A and 7B. In this case, a via-hole electrode 109 is necessary, but because a large number of the signal lines that constitute the bus line 101X are formed in the first wiring layer 101*a*, and connections are made using pad electrodes rather than via-hole electrodes, the separation between the via-hole electrodes 109 is not very close, which is thought to dramatically reduce the effects of noise resulting from the via-hole electrodes 109.

Figure 8:
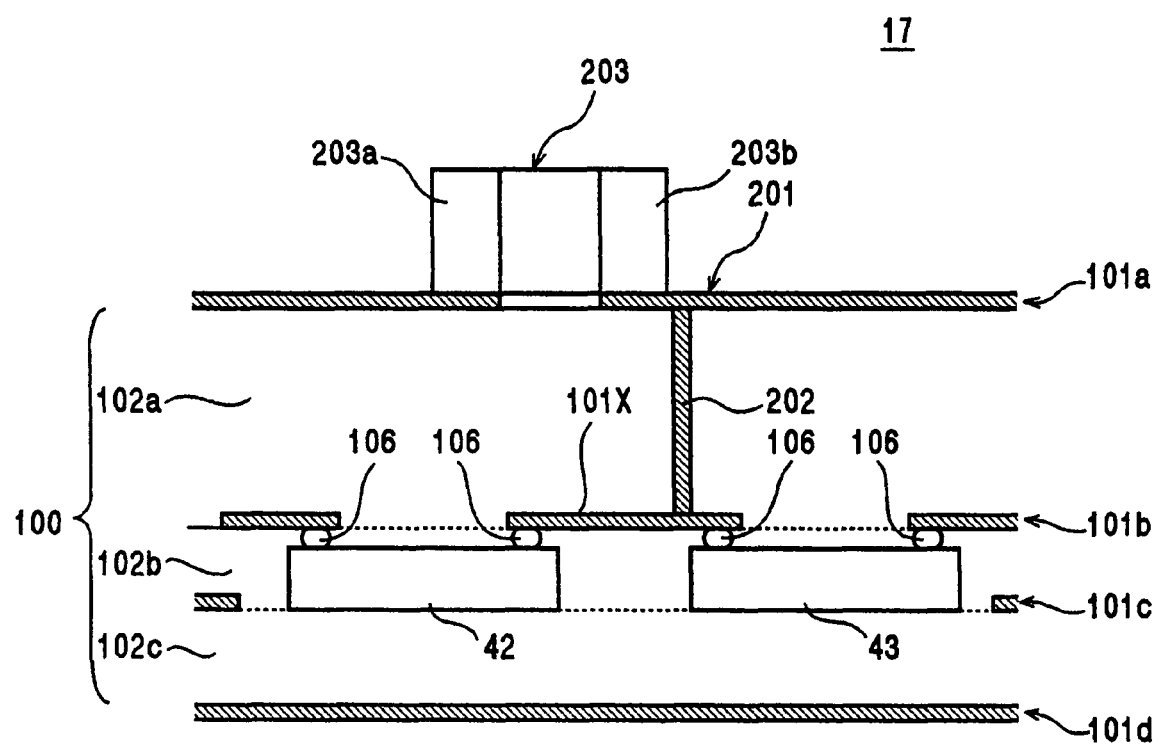
FIG. 8 is a schematic cross-sectional view showing another example of the structure of the first circuit substrate 17.

In addition, chip parts 104 such as passive elements are mounted on the surface of the multilayer substrate 100, and the chip parts may be used in order to form a noise filter that eliminates noise on the bus line 101X. For example, as shown in FIG. 8, a land pattern 201 is formed by removing the conductor at the periphery of a prescribed region in the first ground layer 101*a*, and the land pattern 201 and bus line 101X are connected using a via-hole electrode 202. One terminal 203*a* of a chip capacitor 203 is connected with the first ground layer 101*a*, and another terminal 203*b* is connected with the land pattern 201, thereby forming a bypass capacitor. It is therefore possible to additionally decrease noise generation from the bus line 101X. A one-chip filter circuit may also be mounted instead of a chip capacitor 203, or a plurality of chip parts may be combined together.

Figure 9:
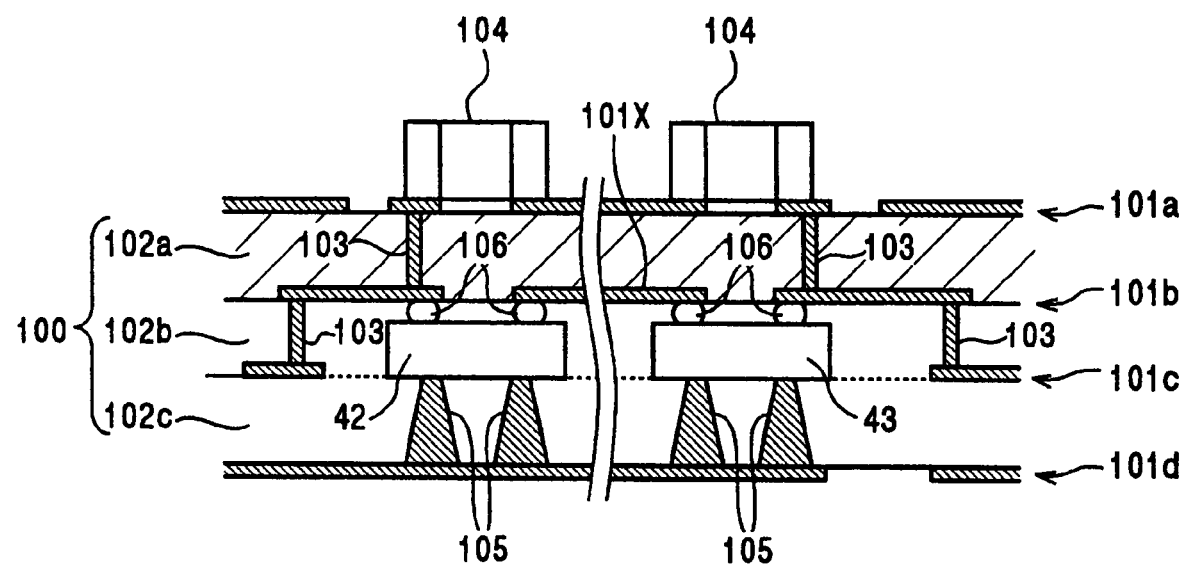
FIG. 9 is a schematic cross-sectional view showing yet another example of the structure of the first circuit substrate 17.

FIG. 9 is a schematic cross-sectional view of yet another example of the structure of the first circuit substrate 17.

As shown in FIG. 9, a characteristic of the first circuit substrate 17 is that the substrate is configured so that the first insulating layer 102a, which is a component of the multilayer substrate 101, includes a ferromagnetic material. Ferrite and ferromagnetic metals may be cited as examples of ferromagnetic materials. Examples of preferred ferrites include those based on Mn—Mg—Zn, Ni—Zn, and Mn—Zn. In addition, examples of preferred ferromagnetic metals include carbonyl iron, iron-silicon alloys, iron-aluminum-silicon alloys (Sendust (trade name)), iron-nickel alloys (Permalloy (trade name)), iron-based amorphous materials, and cobalt-based amorphous materials. By using resin in which this type of ferrite filler or ferromagnetic metal powder has been admixed, the first insulating layer 102a can be configured as a ferromagnetic layer 301.

Figure 10:
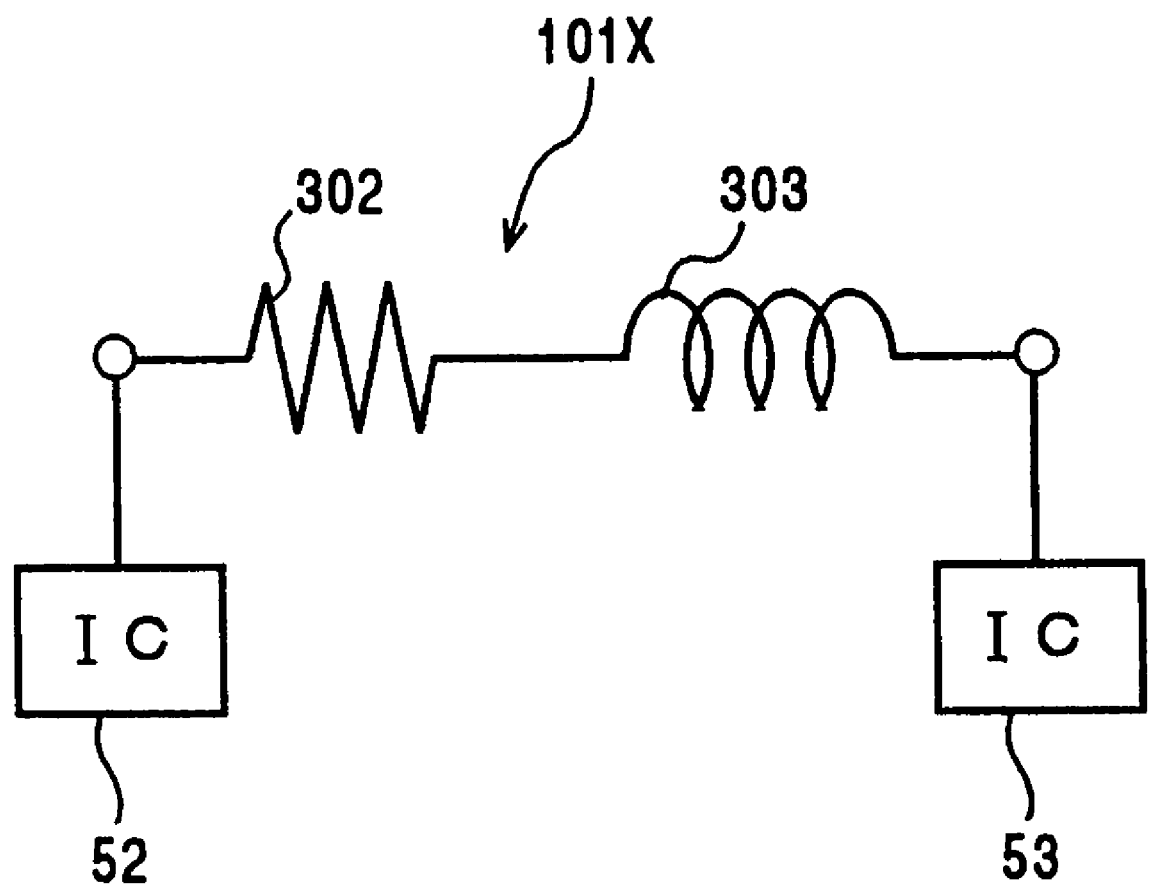
FIG. 10 is an equivalent circuit diagram of the bus line 101X in contact with the magnetic layer 301.

When this type of configuration is used, the bus line 101X in contact with the magnetic layer 301, as shown in FIG. 10, is equivalent to a series circuit having a damping resistor 302 and a bead 303. It is thereby possible to additionally reduce spurious effects, and to additionally reduce noise generated by the bus line In this embodiment, a case was described in which the first insulating layer 101a is configured as a magnetic layer, but the present invention is not limited thereby. The second insulating layer 101b may also be configured as a magnetic layer, or both the first and second insulating layers 101a and 101d may be configured as magnetic layers. In other words, at least one layer selected from the first insulating layer 101a in contact with the top surface of the bus line 101X and the second insulating layer 101b in contact with the bottom surface of the bus line 101X may be configured as a magnetic layer.

Figure 11A:
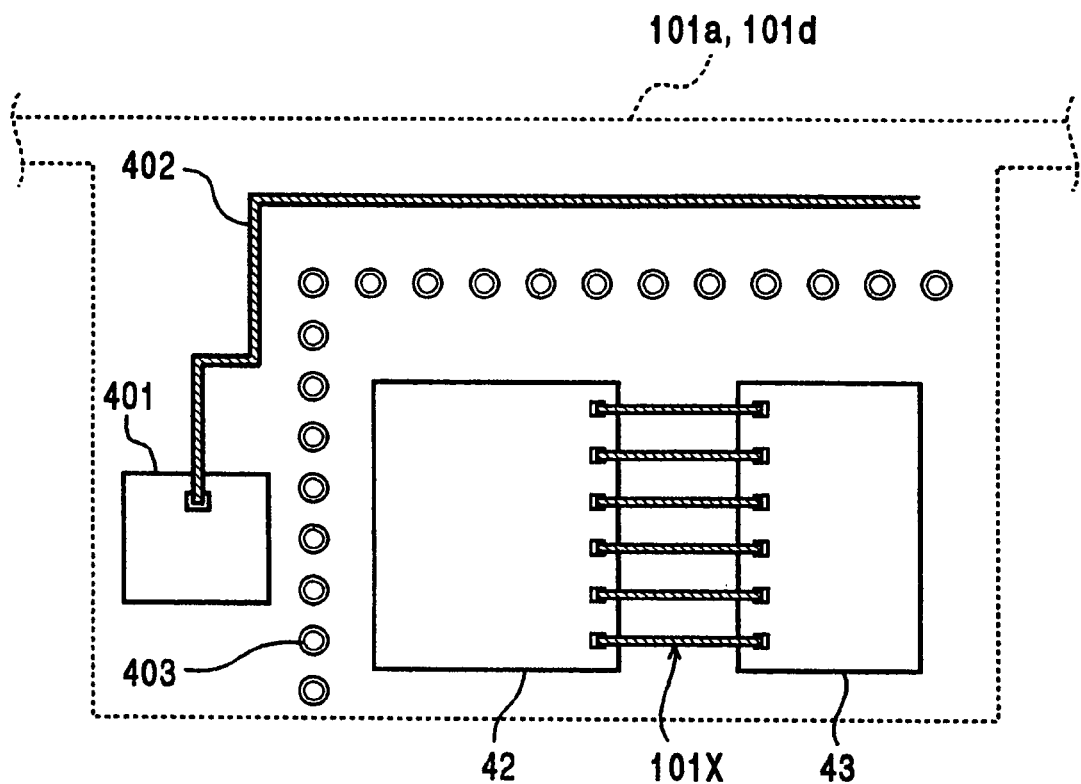
FIG. 11A is a schematic plan view showing yet another example of the structure of the first circuit substrate 17.
Figure 11B:
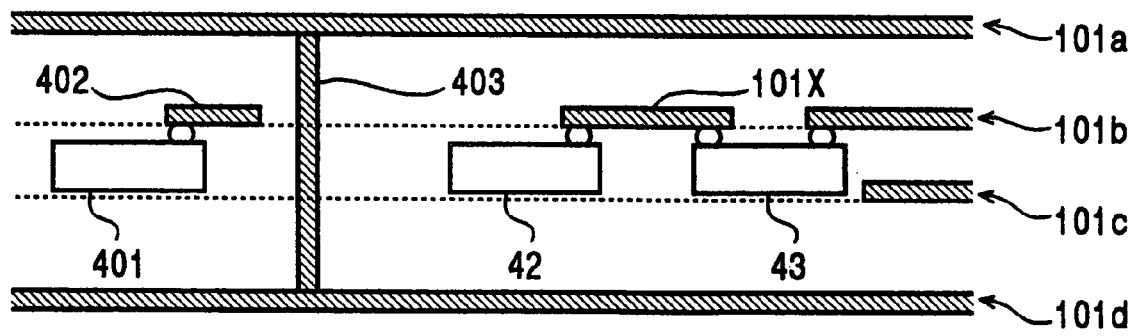

FIG. 11A and 11B are diagrams showing yet another example of the structure of the first circuit substrate 17, where FIG. 11A is a schematic plan view, and FIG. 11B is a schematic cross-sectional view.

As shown in FIG. 11A and 11B, a distinctive feature of the first circuit substrate 17 is that the top and bottom of the bus line 101X and the digital ICs 42 and 43 are covered with first and second ground layers 101a and 101d, and multiple via-hole electrodes 403 that connect the first and second ground layers 101a and 101d are disposed at the periphery of the region (digital circuit region) that has the bus line 101X or digital ICs 42 and 43; particularly, the region between the digital region and the region (analog circuit region) that has the analog circuits 401 or analog signal lines 402. The rest of the configuration is similar to that of the first embodiment. Therefore, the same reference symbols are used for the same constituent elements, and a description thereof is omitted. Multiple signal lines of the analog circuits are also disposed in the wiring layer 101b, and in cases where this configuration is used, the noise that is generated by the bus line 101X and transmitted horizontally along the substrate is shielded by means of an arrangement of the via-hole electrodes 403, allowing the influence of noise generated by the bus lines 101X to be additionally decreased.

FIG. 12A and 12B are diagrams that show yet another example of the structure of the first circuit substrate 17, where FIG. 12A is a schematic plan view and FIG. 12B is a schematic cross-sectional view.

As shown in FIG. 12, a distinctive feature of the first circuit substrate 17 is that the first and second ground layers 101a and 101d are formed separately as digital-side ground regions 101$a_1$ and 101$d_1$ for covering the top and bottom of the region (digital circuit region) in which the bus line 101x and digital IC 42 and 43 are formed in the multilayer substrate 100, and analog-side ground regions 101$a_2$ and 101$d_2$ for covering the top and bottom of the region (analog circuit region) in which the analog circuits or analog signal lines 101Y are formed. In this case, the read/write channel IC 42 and the motor drive IC 43 have both analog circuits and digital circuits. Therefore, as shown in the drawings, the analog-side ground regions 101$a_2$ and 101$d_2$ may partially cover the analog circuits included in the digital ICs 42 and 43. Thus, when the first and second ground layers 101a and 101d are formed as separate digital-side ground regions 101$a_1$ and 101$d_1$ and analog-side ground regions 101$a_2$ and 101$d_2$, the noise that is generated by the bus line 101X and the like is not transmitted to the analog side along the ground layer, and the influence of noise generated by the bus line 101X or the like can be additionally controlled.

FIG. 13 is a schematic external perspective view showing the structure of the mobile telephone that has the aforementioned hard disk drive 10A, and depicts a configuration in which the keypad has been removed.

As shown in FIG. 13, the mobile telephone 50A has a fold-up configuration, and the upper casing 51 and the lower casing 52 of the mobile telephone 50A are rotatably connected by means of a hinge 53. A display 54 and a camera 55 are provided to the upper casing 51. The lower casing 52, on the other hand, has a main substrate 58 and the hard disk drive 10A of the present invention. A battery pack, speaker, and the like are also disposed below the main board 58 or hard disk drive 10a, although these components are not shown in the drawings. During actual use, the keypad 63 is attached to the top surface of the lower casing 52.

When the hard disk drive 10a of the present invention is disposed in the mobile telephone 50A, the circuit substrates needed for forming the hard disk drive 10A are housed in the casing of the hard disk drive 10A, and because unnecessary radiation generated by the circuit board is shielded, it is possible to ensure the desired transmission quality in the mobile telephone that has the hard disk drive. In other words, because a hard disk having exposed digital circuits is not mounted in unmodified form in the mobile telephone, it is possible to minimize influence of high-frequency noise generated by the digital circuits on the wireless systems of the mobile telephone. Consequently, it is possible to create a small, thin mobile telephone that has a built-in hard disk drive and adequate transmission properties.

In addition, the required circuit substrates for the hard disk drive are all disposed in the hard drive casing, and because the hard disk drive can be made small and thin, an extremely small, thin mobile telephone that has a built-in hard disk drive can be produced when the hard disk drive is installed in the mobile telephone. As shown in FIG. 2, when indentations for housing the spindle motor or arm bearing are formed in the casing of the hard disk drive, the maximum thickness of the hard disk drive is restricted by the presence of the indentations (or protrusions when viewed from the back) despite the fact that, for example, a second circuit substrate is not necessary, and thus no great difference in minimum thickness is achieved relative to the prior art. However, because the volume of the hard disk drive as a whole is decreased by the amount required for the second circuit substrate, when this type of hard disk drive is used in mobile telephones, a significant contribution can be made to reducing the size and thickness of the mobile telephone. Specifically, by providing some of the circuits of the mobile telephone in the space (the space in which the second circuit substrate was disposed in the prior art) outside the hard disk drive that is made newly available by disposing the circuit substrate in the casing, it is possible to configure a small, thin mobile telephone that has a hard disk drive.

FIG. 14 is an exploded perspective view that schematically shows the structure of the hard disk drive according to another preferred embodiment of the present invention.

As shown in FIG. 14, this hard disk drive 10B has a platter 11 that is a recording medium, a spindle motor 12 for rotatably driving the platter 11, an arm 14 with a magnetic head 13 attached to a distal end thereof, a bearing 15 that supports a rear end of the arm 14, a voice coil motor 16 for slidably driving the arm 14, a first circuit substrate 17 that is a component of each of the functional block control circuits, a metal casing 18 that houses and electrically shields these components, a metal casing cover 19, a second circuit substrate 22 that is provided outside the casing 18, and a shielding member 23 for covering the exposed surface of the second circuit substrate 22 (shielding plate). A flexible printed substrate 24 is connected to the second circuit substrate 22 as an external interface for the hard disk drive 10B. The rest of the configuration is similar to that of the hard disk drive 10A described above, and a detailed description is therefore omitted (refer to FIG. 3 to FIG. 12).

FIG. 15 is a schematic side view that shows the assembled condition of the hard disk drive 10B of FIG. 14.

As shown in FIG. 15, the casing 18 houses a platter 11, a spindle motor 12, an arm 14, a voice coil motor 16, and a first circuit substrate 17. An opening in the casing 18 is shielded with a casing cover 19. Grooves (indentations) 18b and 18c for housing the spindle motor 12 and arm bearing 15 are provided to the bottom of the casing 18, and the spindle motor 12 and the arm bearing 15 are housed and fixed in the indentations 18b and 18c, respectively.

As shown in the drawings, the second circuit substrate 22 is provided to the external surface of the bottom of the casing 18, and the exposed surface thereof is shielded by a shielding plate 23. Casing depressions 18b and 18c, which are the mounting locations for the spindle motor 12 and the voice coil motor bearing 15, form protrusions when viewed from the back side of the casing 18, and the second circuit substrate 22 is provided in regions other than these protrusions. For this reason, the second circuit substrate 22 is not a simple rectangular substrate, but has a shape produced by punching out circles in the regions corresponding to the protrusions. A detailed description is presented below, but the second circuit substrate 22 of this embodiment is not a circuit that is necessary for a hard disk drive, and constitutes part of the mobile telephone in which the hard disk drive is installed. Thus, the hard disk drive can function even without this second circuit substrate 22.

FIG. 16 is a schematic external oblique view showing the structure of the mobile telephone in which the aforementioned hard disk drive 10B has been installed, and depicts the condition in which the keypad has been removed.

As shown in FIG. 16, the mobile telephone 50B has a fold-up configuration, and the upper casing 51 and lower casing 52 of the mobile telephone 50B are pivotably connected with a hinge 53. A main display 54 and a camera 55 are provided to the upper casing 51. On the other hand, a main substrate 58, an antenna 59, and the hard disk drive 10B of the present invention are installed on the inside of the lower casing 52. Moreover, as described below, a battery pack, speaker, and the like are also disposed below the main substrate 58 or hard disk drive 10B. During actual use, the keypad 63 is attached to the top surface of the lower casing 52.

FIG. 17 is a schematic side cross-sectional view showing the internal structure of the mobile telephone 50B.

As shown in FIG. 17, the upper casing 51 has a main display 54, a camera 55, a bottom surface display 56, and the drive circuits 57 for driving these components. The interior of the lower casing 52, on the other hand, has a main substrate 58, an antenna 59, a battery pack 60, a speaker 61, a hard disk drive 10B, and a keypad 63.

The RF component 58a, power source 58b, and image processor 58c of the mobile telephone 50B are configured on the main substrate 58 in the lower casing 52, whereas the baseband component 58d is configured on the second circuit substrate 22 in the hard disk drive 10B. The main substrate 58 of the mobile telephone 50B and the hard disk drive 10B are connected by a flexible printed substrate 62, and the baseband component 58d is connected with the RF component 58a, the power source 58b, and the image processor 58c by a flexible printed substrate 62. The baseband component 58d of the mobile telephone 50B is constituted by multiple digital ICs. When the baseband component 58d is disposed in the casing of the hard disk drive 10B, the noise generated by the baseband component 58d is shielded, so that effects of the noise on the RF component 58a or power source 58b of the mobile telephone 50B can be sufficiently suppressed. Because frequency distribution formats such as CDMA (code division multiple access) are susceptible to in-band noise, remarkable effects are obtained when this device is used in mobile telephones that employ frequency distribution formats.

As described above, in this embodiment, when the hard disk drive 10B of the present invention is disposed in the mobile telephone 50B, all of the required circuit substrates that constitute the hard disk drive 10B are housed in the casing of the hard disk drive 10B, and unwanted radiation generated by the circuit substrate is thus shielded, thereby ensuring the desired transmission quality in mobile telephones that have hard disk drives. In other words, because the hard disk drive with exposed digital circuits is not installed in unmodified form in the mobile telephone, it is possible to minimize the influence of high-frequency noise generated by the digital circuits on the wireless systems of the mobile telephone. Consequently, it is possible to create a small, thin mobile telephone that has a built-in hard disk drive and adequate transmission properties.

In addition, the required circuit substrates for the hard disk drive are all disposed in the casing, and because the hard disk drive is small and thin, an extremely small, thin mobile telephone that has a hard disk drive can be produced when this hard disk drive is installed in mobile telephones. As shown in FIG. 15, when depression for housing the spindle motor or arm bearing are formed in the casing of the hard disk drive, the maximum thickness of the hard disk drive is restricted by the presence of the depressions (or protrusions when viewed from the back) despite the fact that, for example, a second circuit substrate is not necessary. Consequently, no great difference in minimum thickness is achieved relative to the prior art. However, because the volume of the hard disk drive as a whole is decreased by the amount required for the second circuit substrate, when this type of hard disk drive is used in mobile telephones, a significant contribution can be made to reducing the size and thickness of the mobile telephone. In particular, by utilizing the space (the space in which the second circuit substrate was disposed in the prior art) outside the hard disk drive that is made newly available by disposing the circuit substrate in the casing, and by providing the circuit substrate for producing the baseband component of the mobile telephone in this space, it is possible to more efficiently utilize the space in the mobile telephone, while also shielding the noise that is generated by the baseband component 58d. As a result, influence of the noise on the mobile telephone RF component 58*a* or power source 58*b* can be sufficiently suppressed. Because frequency distribution formats such as CDMA (code division multiple access) are particularly susceptible to in-band noise, this effect is dramatic when used in mobile telephones that employ frequency distribution formats. Also, in cases in which the mobile telephone has an antenna, the reception sensitivity is dramatically reduced by noise in the mobile telephone, and the effects of the present invention are thus marked.

The present invention is not restricted to the above-described embodiments, and various modifications can be included that do not depart from the spirit of the present invention. It is apparent that these modifications are also within the scope of the present invention.

For example, in this embodiment, a case was described in which one of the upper and lower ground layers was provided as an inner layer in multilayer substrate, but the multilayer substrate may also have a multilayer structure with five or more layers, and the upper and lower ground layers may also both be formed as internal layers of the multilayer substrate.

In the above-described embodiment, a case was described in which the read/write channel IC 42 and the motor driver IC 43 are embedded in the first circuit substrate 17, but the present invention is not restricted to this configuration. For example, it is also possible to use a system LSI in which a hard disk controller, microcomputer, and memory are integrated on a single chip, and the system LSI is embedded along with the read/write channel IC and motor driver IC in the substrate. In this case, it is possible to achieve high-density mounting using minimal wiring.

Moreover, a case was described in this embodiment in which the hard disk drive 10A or 10B of the present invention was installed in a mobile telephone, but the present invention is not restricted to mobile telephones. For example, the device may be installed in various types of wireless data terminals such as PDAs and handheld game devices that have communication functions. In such cases as well, the same effects as with mobile telephones can be obtained.

What is claimed is:

1. A hard disk drive comprising:
    a platter;
    a spindle motor for driving the platter;
    an arm with a magnetic head attached to a distal end thereof;
    a voice coil motor for driving the arm;
    a first circuit substrate; and
    a drive casing for accommodating and electrically shielding the platter, spindle motor, arm, voice coil motor, and first circuit substrate, wherein
    the first circuit substrate has a multilayer substrate, a plurality of digital ICs that are embedded as bare chips in the multilayer substrate, and a bus line for connecting the digital ICs;
    first and second ground layers for respectively covering the top and bottom of a bus line; and
    the digital ICs are disposed in a mutually horizontal configuration.

2. The hard disk drive as claimed in claim 1, wherein the digital ICs contain a read/write channel IC and a motor driver IC.

3. The hard disk drive as claimed in claim 1, wherein the digital ICs also contain a system LSI having a hard disk controller, microprocessor, and memory as components.

4. The hard disk drive as claimed in claim 1, wherein electronic components are mounted on at least one surface selected from the top surface and bottom surface of the multilayer substrate.

5. The hard disk drive as claimed in claim 4, wherein the electronic components contain a head amplifier IC.

6. The hard disk drive as claimed in claim 1, wherein the multilayer substrate has a plurality of layered insulating layers and wiring layers provided between the plurality of insulating layers; and
    part of the wiring layer constitutes the bus line.

7. The hard disk drive as claimed in claim 6, wherein all of the signal lines that constitute the bus line are provided to the same wiring layer.

8. The hard disk drive as claimed in claim 6, wherein part of a signal line that constitutes the bus line and is a part that intersect with at least another signal line is provided to a layer that is different from the wiring layer.

9. The hard disk drive as claimed in claim 6, wherein, at least one insulating layer selected from the insulating layer that is in contact with the top and bottom surface of the bus line is configured to include a ferromagnetic material.

10. The hard disk drive as claimed in claim 1, wherein
    the first ground layer is formed on the top surface of the multilayer substrate; and
    the second ground layer is formed on the bottom surface of the multilayer substrate.

11. The hard disk drive as claimed in claim 1, wherein the digital IC and bus line are substantially directly connected via conductive protrusions.

12. The hard disk drive as claimed in claim 1, wherein the first and second ground layers are formed separately as a digital-side ground region for covering a digital circuit region having the digital ICs, and an analog-side ground region for covering an analog circuit region provided to the same layer as the digital circuits.

13. The hard disk drive as claimed in claim 1, further comprising a thermal via that is connected to the bottom surfaces of the digital ICs embedded in the multilayer substrate.

14. The hard disk drive as claimed in claim 1, further comprising:
    an external interface provided to the first circuit substrate; and
    a filter circuit provided on a line connected to the external interface.

15. A hard disk drive, comprising:
    a platter;
    a spindle motor for driving the platter;
    an arm with a magnetic head attached to a distal end thereof;
    a voice coil motor for driving the arm;
    a first circuit substrate; and
    a drive casing for accommodating and electrically shielding the platter, spindle motor, arm, voice coil motor, and first circuit substrate, wherein
    the first circuit substrate has a multilayer substrate, a plurality of digital ICs that are embedded as bare chips in the multilayer substrate, and a bus line for connecting the digital ICs;
    a shielding member disposed in a region between a digital circuit region having the digital ICs, and an analog circuit region provided to the same layer as the digital circuit region; and
    the digital ICs are disposed in a mutually horizontal configuration.

16. The hard disk drive as claimed in claim 15, wherein the shielding member is a via-hole electrode for connecting the first and second ground layers.

17. A wireless data terminal comprising:
    at least an antenna;

an RF component connected to the antenna;
a baseband component connected to the RF component;
a hard disk drive, comprising:
  a platter;
  a spindle motor for driving the platter;
  an arm with a magnetic head attached to a distal end thereof;
  a voice coil motor for driving the arm;
  a first circuit substrate; and
  a drive casing for accommodating and electrically shielding the platter, spindle motor, arm, voice coil motor, and first circuit substrate, wherein
  the first circuit substrate has a multilayer substrate, a plurality of digital ICs that are embedded as bare chips in the multilayer substrate, and a bus line for connecting the digital ICs; and
  the digital ICs are disposed in a mutually horizontal configuration; and
a terminal casing for accommodating the RF component, the baseband component, and the hard disk drive, wherein the hard disk drive further has a second circuit substrate that is provided to the external surface of the terminal casing and is electrically connected to the first circuit substrate; and
a shielding member for covering the exposed surface of the second circuit substrate, and wherein
at least the baseband component is formed on the second circuit substrate.

18. The wireless data terminal as claimed in claim 17, wherein the antenna is provided to the interior of the terminal casing.

19. The wireless data terminal as claimed in claim 17, further comprising:
  an image processor for processing image data; and
  a display for displaying image data, wherein
  the image processor is also formed on the second circuit substrate.

20. The wireless data terminal as claimed in claim 17, further comprising:
  an external interface provided to the first circuit substrate; and
  a filter circuit provided on a line connected to the external interface 21. The hard disk drive as claimed in claim 17, further comprising a thermal via that is connected to the bottom surfaces of the digital ICs embedded in the multilayer substrate.

* * * * *